United States Patent
Fallahi et al.

(10) Patent No.: US 6,436,613 B1
(45) Date of Patent: Aug. 20, 2002

(54) INTEGRATED HYBRID OPTOELECTRONIC DEVICES

(75) Inventors: Mahmoud Fallahi; Amir Fardad, both of Tucson, AZ (US)

(73) Assignee: The Arizona Board of Regents, Tucson, AZ (US)

( * ) Notice: Subject to any disclaimer, the term of this patent is extended or adjusted under 35 U.S.C. 154(b) by 0 days.

(21) Appl. No.: 09/643,875

(22) Filed: Aug. 23, 2000

Related U.S. Application Data

(60) Provisional application No. 06/150,281, filed on Aug. 23, 1999, provisional application No. 60/150,289, filed on Aug. 23, 1999, and provisional application No. 60/150,282, filed on Aug. 23, 1999.

(51) Int. Cl.[7] ............... G03F 7/00; G02B 6/10; H01P 11/00
(52) U.S. Cl. ............ 430/321; 430/313; 430/317; 430/319; 430/330; 438/31; 438/32; 438/35; 216/2; 216/24
(58) Field of Search ............... 430/313, 317, 430/319, 330, 321; 438/31, 32, 35; 216/2, 24

(56) References Cited

U.S. PATENT DOCUMENTS

| | | | |
|---|---|---|---|
| 5,238,877 A | | 8/1993 | Russell ............ 437/231 |
| 5,363,238 A | * | 11/1994 | Akune et al. ............ 359/566 |
| 5,602,863 A | * | 2/1997 | Itagaki ............ 372/50 |
| 5,613,993 A | * | 3/1997 | Richards ............ 65/17.2 |
| 5,849,215 A | * | 12/1998 | Gin et al. ............ 252/299.01 |
| 6,001,165 A | * | 12/1999 | Shibuya et al. ............ 106/287.17 |
| 6,054,253 A | * | 4/2000 | Fardad et al. ............ 430/321 |
| 6,064,783 A | * | 5/2000 | Congdon et al. ............ 385/15 |
| 6,134,257 A | * | 10/2000 | Capasso et al. ............ 372/94 |
| 6,141,465 A | * | 10/2000 | Bischel et al. ............ 385/4 |
| 6,172,777 B1 | * | 1/2001 | Flood et al. ............ 359/10 |
| 6,181,721 B1 | * | 1/2001 | Geels et al. ............ 372/45 |
| 6,236,774 B1 | * | 5/2001 | Lackritz et al. ............ 385/14 |

FOREIGN PATENT DOCUMENTS

| | | |
|---|---|---|
| JP | 4-335317 | 11/1992 |
| JP | 6-167622 | 6/1994 |
| WO | WO 98/26315 | 6/1998 |

\* cited by examiner

*Primary Examiner*—Mark F. Huff
*Assistant Examiner*—Daborah Chacko-Davis
(74) *Attorney, Agent, or Firm*—Oblon, Spivak, McClelland, Maier & Neustadt, P.C.

(57) ABSTRACT

A hybrid optoelectronic device and method of producing the hybrid device in which the hybrid device includes a substrate with an input region configured to accept input light, a sol-gel glass multimode interference region coupled to and contiguous with the input region and configured to accept and replicate the input light as multiple self-images, and a sol-gel glass output region contiguous with the multimode region and configured to accept and to output the multiple self-images. Alternatively, the hybrid optoelectronic device includes a substrate with a photoelectronic device, a surface resonator including a light-emitting part of the photelectronic device and configured to resonate light from the photoelectronic device to produce a laser light, and a grating outcoupler contiguous with the surface resonator and configured to diffract the laser light outward from the grating outcoupler and to electrically vary an index of refraction of the outcoupler and change a direction of the diffracted laser light.

55 Claims, 18 Drawing Sheets

INTEGRATED HYBRID OPTOELECTRONIC DEVICES

CROSS-REFERENCE TO RELATED APPLICATIONS

This application claims benefit of priority under 35 U.S.C. §119 to U.S. provisional applications Nos. 60/150,281, 60/150,289, and 60/150,282 each filed on Aug. 23, 1999, the entire contents of which are incorporated by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of F19628-96-K-0006/P00003 awarded by the Defense Advanced Research Projects Agency/Air Force Office of Scientific Research.

BACKGROUND OF THE INVENTION

1. Field of the Invention

The present invention relates to production of hybrid optoelectronic devices which integrate active optoelectronic and passive optical components into novel hybrid optical devices to be used in optoelectronic systems.

2. Discussion of the Background

In customer optoelectronic systems, large bandwidth, polarization insensitive, low loss devices are required for multi-channel broadcasting. Optical component processing based on self-imaging devices such as multimode interference (MMI) devices is an attractive choice for fabrication. Indeed, due to excellent optical properties and ease of fabrication, multimode interference (MMI) devices have already found applications in laser modulators, splitters, switches, and receivers. Production MMI power splinters, as compared with conventional 1×2 waveguide branches, yield devices with smaller dimensions and do not suffer from non-uniformity of output power as a result of sharp edges near the waveguide branches.

From a component viewpoint, a subscriber loop requires massive power splitting for distribution purposes. As needs in the customer loop intensify, ultra small-dimension, large bandwidth, low loss, low reflection and polarization insensitive devices will be required to accomplish a variety of optical processing, such as for example signal splitting. Furthermore, wavelength division multiplexing (WDM) soon will impact nearly all optical network systems. WDM, by itself, requires integration of a number of active and passive optical components including multi-wavelength sources, multiplexers, wavelength add-drop filters and switches. Due to the diverse characteristics of each of these components, integration onto a singular substrate is an imposing problem with conventional fabrication procedures and standard optical glass materials.

Furthermore, the increasing demand for optoelectroninc systems presents a need in long distance free space applications for optoelectronic systems utilizing steerable high power surface emitting lasers. The development of high power diode lasers with integrated steering capability will play a significant role in free space tracking and communication. Here, as with WDM, integration of optical components onto a singular substrate represents a complex problem.

Sol-gel processing, which utilizes low temperature polymerization, has stimulated considerable research. The sol-gel process can be considered as a method for producing glass and ceramic materials from metallorganic precursors by low temperature polymerization reactions. H. K. Schmidt in "Sol-gel and polymer photonic devices," SPIE Critical Review, vol. CR68, pp. 192–203, 1995 discloses sol gel processing as a tool for making diverse transparent materials with interesting optical or photonic properties.

However, one obstacle for application of sol-gel inorganic materials into optical devices is the limitation imposed by the maximum attainable crack-free sol-gel glass thickness. Glass-on-silicon technology compatible with single mode fiber for 1.55-$\mu$m window requires channel waveguides typically greater than 1$\mu$m in thickness. Fabrication of such components based on oxygen-metal-oxygen materials normally demands iterative cycles of deposition, baking at temperatures around 1000° C., and dry etching. Thus, these processes are costly and time consuming.

Introduction of non-volatile organic groupings with a metal backbone has led to interesting materials, such as organically modified silicon and zirconium alkoxides as discussed by H. K. Schmidt, supra, that have substantially reduced the processing demands.

Relaxation in the processing temperature by incorporating organic groupings, used either as a host or a guest, which can modify the inorganic backbone and reduce the connectivity of the sol-gel network allows thicker film deposition and a lowering of the processing temperature compared to sols which do not include the organic groupings. Furthermore, M. A. Farad et al., in Applied Optics vol. 37, pp. 2429–2434, 1998, and in Electronics Letters, vol. 34, pp. 1940–1941, 1998 disclose use of photopolymerizable organic groups, utilizing organic groupings containing unsaturated bonds, C=C double bond in vinyl or methacryl groups, to enables photopolymerization, and thus, the capability to pattern sol-gel glasses using lithographic techniques. In U.S. Pat. No. 6,054,253, M. A. Fardad et al. disclose photopatternable organically modified silicates doped with modified zirconium and buthoxyaluminoxytriethoxysilane. However, these materials were require rigorous synthesis and patterning procedures, not conducive to optical device integration.

Thus, a number of issues regarding loss inherent from the sol-gel processing have not been resolved which limit the application of sol-gel processing and thus restrict optical device integration, especially between diverse active and passive optical components. These issues include inherent losses in the sol gel glasses at the operating frequency, unintentional losses due to light scatter at sol-gel glass/air interfaces, and improper design of passive optical components.

As a consequence of the complexities of the integration process and the lack of a suitable sol-gel medium, optoelectronic systems coupling light output from photoelectronic devices into power splitters and beam steering elements have not been integrated onto a singular substrate.

SUMMARY OF THE INVENTION

Accordingly, one object of the present invention is to provide a sol-gel application process which overcomes shortcomings of traditional sol gel materials and has the requisite low-loss, polarization insensitivity, and large bandwidth needed for integration of active and passive optical components into complex optoelectronic devices.

Another object of the present invention is to integrate low-loss and low-cost sol-gel based glass waveguides with active optoelectronic devices to provide a platform for hybrid optoelectronic integration, wherein silicon substrates can be used as heat sinks and optical benches for optoelectronic chips such as laser diodes, coupling output from the optoelectronic devices into passive glass waveguides (filters, splitters, etc.)

Still a further object of the present invention is to provide a sol-gel with low internal loss and excellent surface smoothness to minimize both internal absorption of light and light scattering, both of which diminish optical transmission through a device.

In a preferred embodiment of the present invention, the sol-gel material is derived from a sol containing methacryloxy propyl trimethyoxysilane (MAPTMS) and aluminum alkoxide and hydroxy methyl methaacryloxy propiophene (HMPP) diluted to appropriate viscosity with ethanol. The sol-gel material is aged for a prescribed period of time, spun onto a substrate, and cured for a prescribed period of time to produce the afore-said surface smoothness properties.

Another object of the present invention is to provide a sol-gel application and curing process which produces patterned sol-gel optical structures having improved surface properties and predetermined dimensions, wherein unwarranted light scattering within the hybrid optoelectronic devices is prevented.

Accordingly, a further object of the present invention is to provide a fabrication process to produce the complex optoelectronic devices in which design tolerances are specified to minimize optical losses, especially at interfaces between different optical components.

In one embodiment of the present invention, vinyltriethoxysilane (VTES) forms at least one of a cladding layer and a planarization layer above the above-mentioned sol-gel optical components.

Specifically, a further object of the present invention is to provide a sol-gel-based MMI power splitter integrated with distributed Bragg reflector (DBR) laser.

In addition, another object of the present invention is to provide, without sol-gel processing, an integrated optoelectronic device such as for example a distributed Bragg reflector laser which includes an outcoupling layer which upon current injection changes the index of refraction of the outcoupling layer and thus electronically controls a direction of an output light.

These and other objects are provided for in the present invention by a hybrid optoelectronic device and method of producing the hybrid device in which the hybrid device includes a substrate with an input region configured to accept input light, a sol-gel glass multimode interference region coupled to and contiguous with the input region and configured to accept and replicate the input light as multiple self-images, and a sol-gel glass output region contiguous with the multimode region and configured to accept and to output the multiple self-images. Alternatively, the hybrid optoelectronic device can include a substrate with a photoelectronic device, a surface resonator including a light-emitting part of the photelectronic device and configured to resonate light from the photoelectronic device to produce a laser light, and a grating outcoupler contiguous with the surface resonator and configured to diffract the laser light outward from the grating outcoupler and to electrically vary an index of refraction of the grating outcoupler and direct emission of the laser light from the outcoupler

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF PREFERRED EMBODIMENTS

Figure 1A:
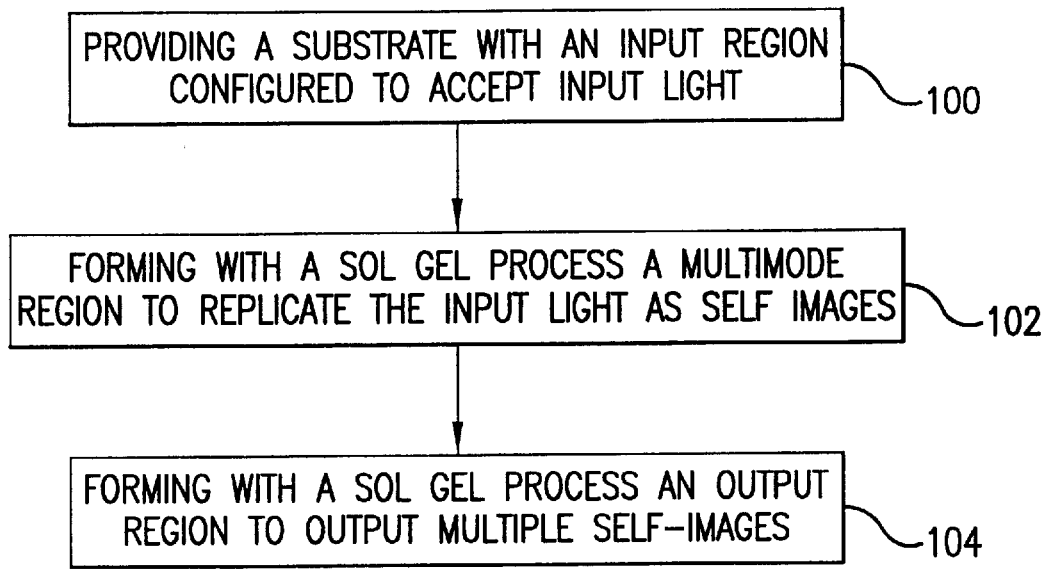
FIG. 1a is a flow chart showing steps according to the present invention which based on sol gel processing produce hybrid optoelectronic devices integrating passive optical components with active optoelectronic components.

Referring now to the drawings, wherein like reference numerals designate like or corresponding parts throughout the several views, and more particularly to FIG. 1a thereof, FIG. 1a is a flow chart showing processing steps according to the present invention which based on sol gel processing produce hybrid optoelectronic devices integrating passive optical components with active optoelectronic components. Fabrication of hybrid optoelectronic devices using sol-gel processing requires, in addition to lossless sol gel materials, a detailed knowledge of the optical properties of the cured sol gel material, such as optical loss, optical index, optical index dispersion, and polarization sensitivity. The fabrication process utilizes steps which integrate the sol-gel materials with traditional optical materials and active optoelectronic components such that unintentional losses from light scattering are avoided. Control of these losses depends not only on the internal and surface properties of the cured sol-gel material but also patterning and dimensional control of the optical components. The patterning and dimensional control must not compromise the internal and the surface properties of the resultant cured sol-gel material.

In FIG. 1a, at step 100, a substrate with an input region configured to accept an input light is provided. In step 102, a mulitmode region is formed using a sol-gel process, the multimode region is configured to replicate the input light as self images. At step 104, an output region is formed using a sol-gel process, the output region is configured to output multiple self images.

Figure 1B:
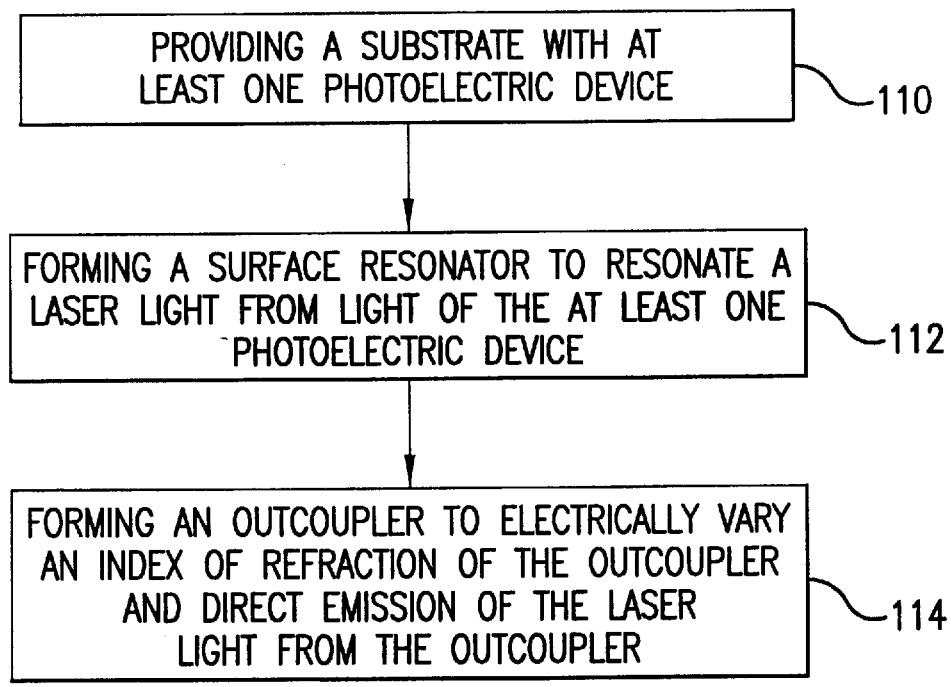
FIG. 1b is a flow chart showing steps according to the present invention in which passive optical devices are formed directly on a substrate without sol-gel processing.

Alternatively, the production of integrated hybrid optoelectronics can proceed without the use of sol-gel processing wherein passive optical devices are formed directly on a substrate for the hybrid optoelectroninc device. In FIG. 1b at step 110, a substrate with at least one photoelectronic device is provided. The photoelectronic device, for example, could be a laser diode. At step 112, a surface resonator is formed to resonate light of the at least one photoelectronic device to produce a laser light. In step 114, a grating outcoupler is formed outward from the surface resonator which diffracts the laser light from the outcoupler. In a preferred embodiment of the present invention, a transparent conductor such as indium tin oxide is used on the grating outcoupler by which electrically an index of refraction of the outcoupler can be varied to direct the laser light from the outcoupler.

Figure 2:
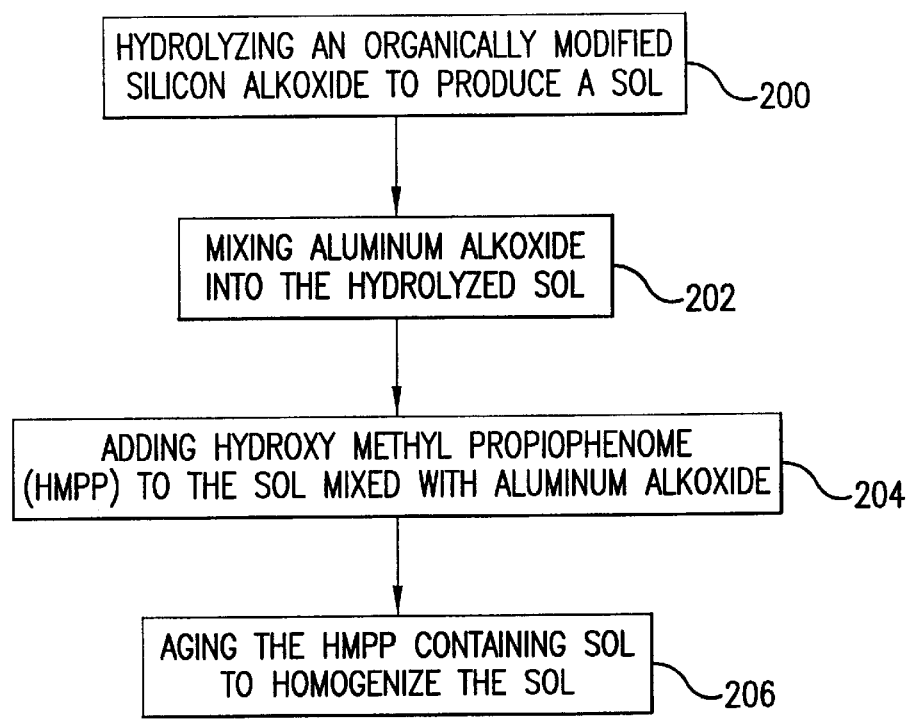
FIG. 2 is a flow chart showing steps according to the present invention which produce a sol gel material with optical properties suitable for optoelectronic devices including a surface roughness of less than 0.1 $\mu$m.

Controlling losses in integrated optoelectronic components depends on minimizing not only internal losses but also losses at surfaces and interfaces of the optoelectronic components. For example, surface roughness needs to minimized to avoid scattering of light at interfaces between air and waveguides. The resultant sol-gel films of the present invention yield a transparent sol-gel film with low loss and smooth surfaces. FIG. 2 is a flow chart showing steps according to the present invention which produce a sol-gel glass which with proper application and curing has a surface roughness of less than +/−0.01 $\mu$m.

In FIG. 2, at step 200, an organically modified silicon alkoxide, such as for example methacryloxy propyl trimethoxy silane, is hydrolyzed to produce a sol. The hydrolyzation can occur by mixing one mole of 0.01 M HCl into the organically modified silicon alkoxide. At step 202, aluminum-tri-sec-butoxide is mixed into the hydrolized sol. In step 204, 2-hydroxy-2-methylpropiophenone, a photoinitiator is mixed into the hydrolized sol. Finally, in step 206, the sol containing the photoinitiator is aged to homogenize the sol.

More specifically, the steps of forming a photoinitiated sol, according to the present invention, occur under vigorous stirring conditions.

Following the steps shown in FIGS. 1 and 2, a homogenous sol is produced, applied to a substrate with active optoelectronic components, patterned, and cured to produce hybrid optoelectronic devices. However, realization of hybrid optoelectronic devices which combine passive and active optical components depends not only on the sol-gel and its processing but also on dimensional control and patterning, especially in optical components in which geometry and dimensions determine a particular optical mode of operation.

Design of Integrated Multimode Optical Devices

Prior to fabrication of various integrated optical components, design criteria based on theoretical modeling of multimode splitters were tested and evaluated. Realization of operational multimode splitters based on this design criteria established a base technology for the production of hybrid optoelectronic devices which integrated sol-gel-based multimode devices with conventional optical substrate materials and solid state laser diodes.

Figure 3:
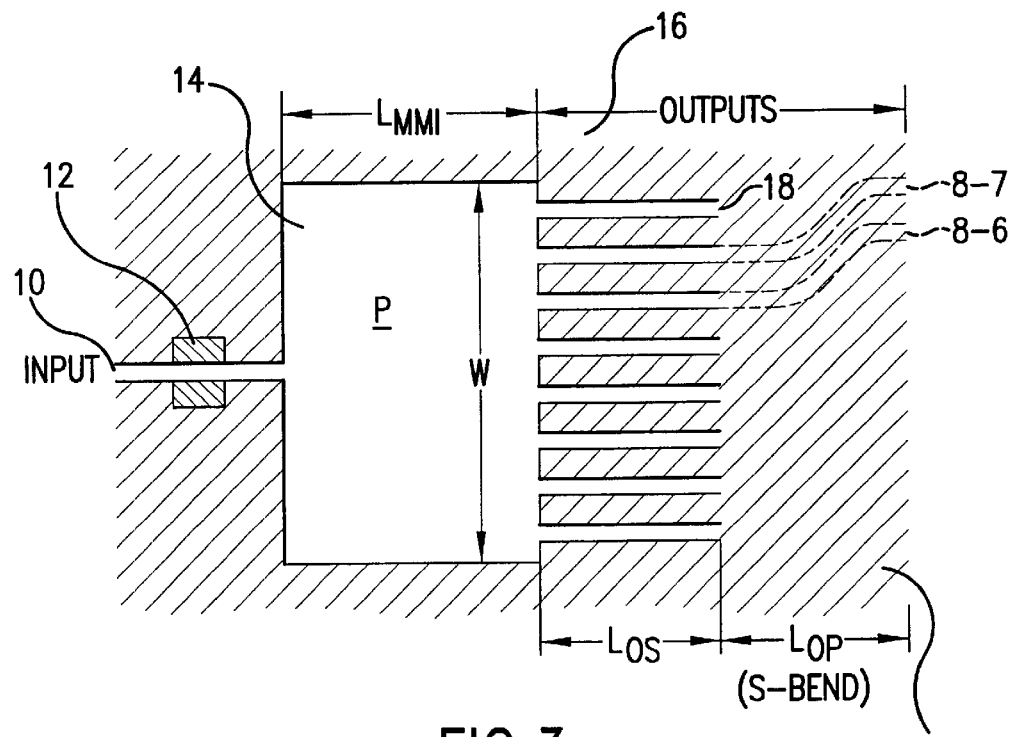
FIG. 3 is a schematic of a 1×8 MMI power splitter integrated with a Bragg reflector.

FIG. 3 is a schematic of an 1×8 MMI power splitter fabricated by the above-discussed sol-gel process. The MMI splitter is designed for transmission in a 1.55 $\mu$m optical window. FIG. 3 shows that the 1×8 MMI power splitter of the present invention includes an input 10, a Bragg reflector 12, a multimode interference region 14, and an output region 16. Light input from a source such a laser is coupled to the multimode interference region 14 via the Bragg reflector 12. As will be explained below, multiple images (i.e. self-images) of the input light appear at a position in the multimode region. Outputs 8-1 to 8-8 in the output region 16 couple to these multiple images, thus splitting the input light into a plurality of output signals.

Multimode interference effects are inherent properties of multimode waveguides in which an original image in a single mode optical field is split into multiple images (self-images) at periodic intervals along a propagation direction. The multiple images are recombined back into the original image to resume the process. With knowledge of the refractive index of a particular sol-gel-based material intended for application in the multimode waveguide, available software tools such as a beam propagation method (BPM) can be utilized for modeling and testing of design choices.

Simulation of optical field evolution through the MMI region allows theoretical prediction of a position in the MMI region to introduce channel waveguides (i.e. at a position of the self-images) in order to manifest various optical components, such as splitters, combiners and routers. As shown in FIG. 3, a single input waveguide (here depicted as a Bragg reflector) is connected to a multimode region having a defined width W. The multimode region terminates at the position of the self-images, and single-mode output waveguides begin at that position. The center-to-center spacing of output waveguides immediately after the MMI region is given by W/8. This spacing can gradually increase with S-Bend waveguides to extend the system of fibers.

The length of MMI region, $L_{MMI}$ is calculated by equation (1)

$$L_{MMI} = \frac{n_e W_e^2}{N \lambda_o} \quad (1)$$

where $n_e$ is the effective index of waveguide mode, $W_e$ is the effective width of the MMI region taking into account Goos-Hähnchen shifts at both boundaries, $\lambda_o$ is the free space wavelength, and N is the number of outputs ($2^n$, n=1, 2, ...). The BPM software uses finite difference calculations to simulate optical field propagation. Input to the calculations were single-mode input and output ridge waveguides 5 μm in width, $n_c$1.465 (sol-gel), and $n_s$=1.445 ($SiO_2$). Dimensions of the input waveguides are 2–3 μm in height and 5 μm in width. Simulation, with these input parameters and the geometrical arrangement as shown in FIG. 3, determined that a spacing between the output waveguides of ≧5 μm is needed to avoid significant coupling between the output waveguides. In the calculations, the output waveguides have the same height and width dimensions as the input waveguides. A center to center spacing between the output waveguides of 12.5 μm was set by considering sol/gel fabrication tolerance and structure compactness. The MMI width was accordingly calculated at 100 μm (e.g. 8×12.5 μm).

Figure 4A:
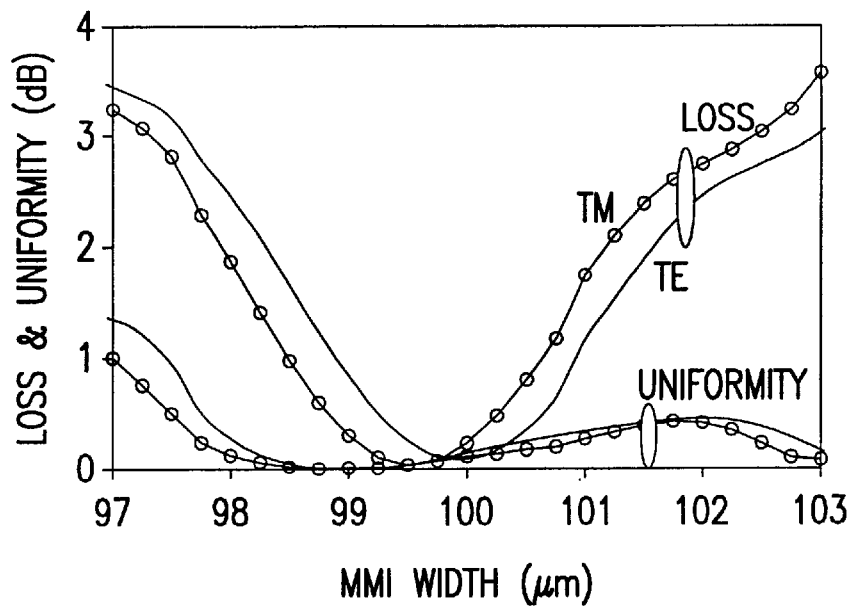
FIG. 4a is a diagram illustrating the loss and power uniformity of a 1×8 MMI power splitter at 1550 nm versus length of MMI region for a fixed width.
Figure 4B:
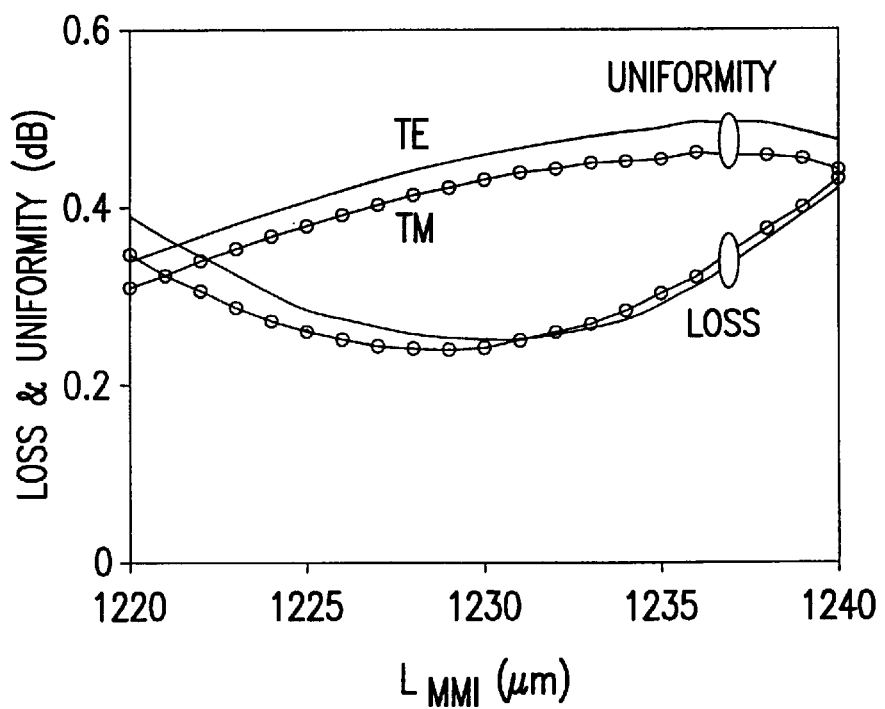
FIG. 4b is a diagram illustrating the loss and power uniformity of a 1×8 MMI power splitter at 1550 nm versus width of MMI region for a fixed length.

Equation (1) shows that the length of MMI devices and thus the operation of the MMI power splitter is sensitive to the MMI width. To ascertain the extent of this sensitivity, the loss and uniformity (i.e. the ratio of minimum and maximum power in the output waveguides) was calculated at $\lambda_o$=1.55 μm for fixed W by varying $L_{MMI}$, and vice versa. The numerical results from such calculations are shown in FIG. 4a and 4b for TE and TM polarization. Lower loss materials (e.g., 0.16 dB) in the optical power splitter, for W=100 μm and $L_{MMI}$=1230 μm, leads to higher tolerant devices. Although a region of excellent uniformity is shown in FIG. 4a (i.e., the region around the MMI width of 98.5 μm), loss in this region is ~1 dB. If a loss of ≦0.16 dB (≦0.32 dB total) is to be realized in an actual power splitter, the loss of ≦0.16 dB corresponds to a change of ±0.5 μm in W and ±10 μm in $L_{MMI}$.

Hence, the operation of MMI splitter is more sensitive to the width than the length, and the width should be carefully controlled during optical device fabrication. From equation (1), a sensitivity similar to that of the MMI splitter's sensitivity to length can be deduced for a wavelength dependence. The wavelength sensitivity of the MMI splitter indicates that formation of self-images in MMI devices is phase sensitive, and hence MMI splitters are designed differently according to the optical communication window being used.

In a preferred embodiment of the present invention, a straight channel 18, $L_{os}$=1 mm, as shown in FIG. 3 between the MMI 14 and S-Bend region 20 is incorporated into the MMI splitter due to perturbations in the optical fields at an entry into the output waveguides. The straight channel 18 allows optical fields to relax in the Los region before entering the S-bend regions, thus reducing losses and improving uniformity. The outermost S-Bend waveguides suffer the largest loss. Assuming a bending loss of ≦0.05 dB for each S-Bend, a $L_{op}$=5 mm was determined by the BPM calculations. Thus, the 1×8 MMI power splitter's total length becomes 7.23 mm.

Figure 5:
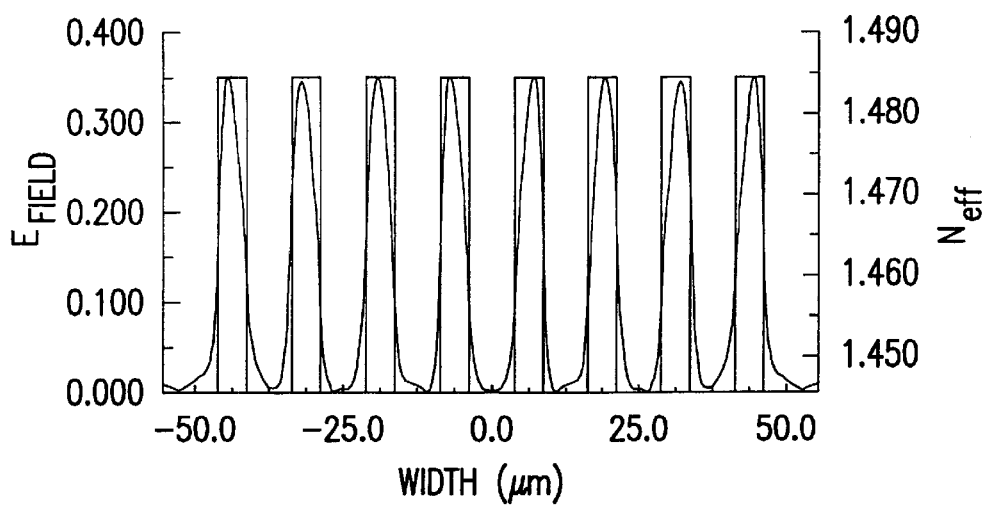
FIG. 5 is a diagram depicting optical field amplitudes of a 1×8 MMI splitter output based on a beam propagation method simulation.

A typical BPM field simulation of the designed 1×8 MMI splitter is shown in FIG. 5 which shows that optical field amplitudes are uniformly split into all the output waveguides indicating accurate design of the MMI splitter.

Figure 6:
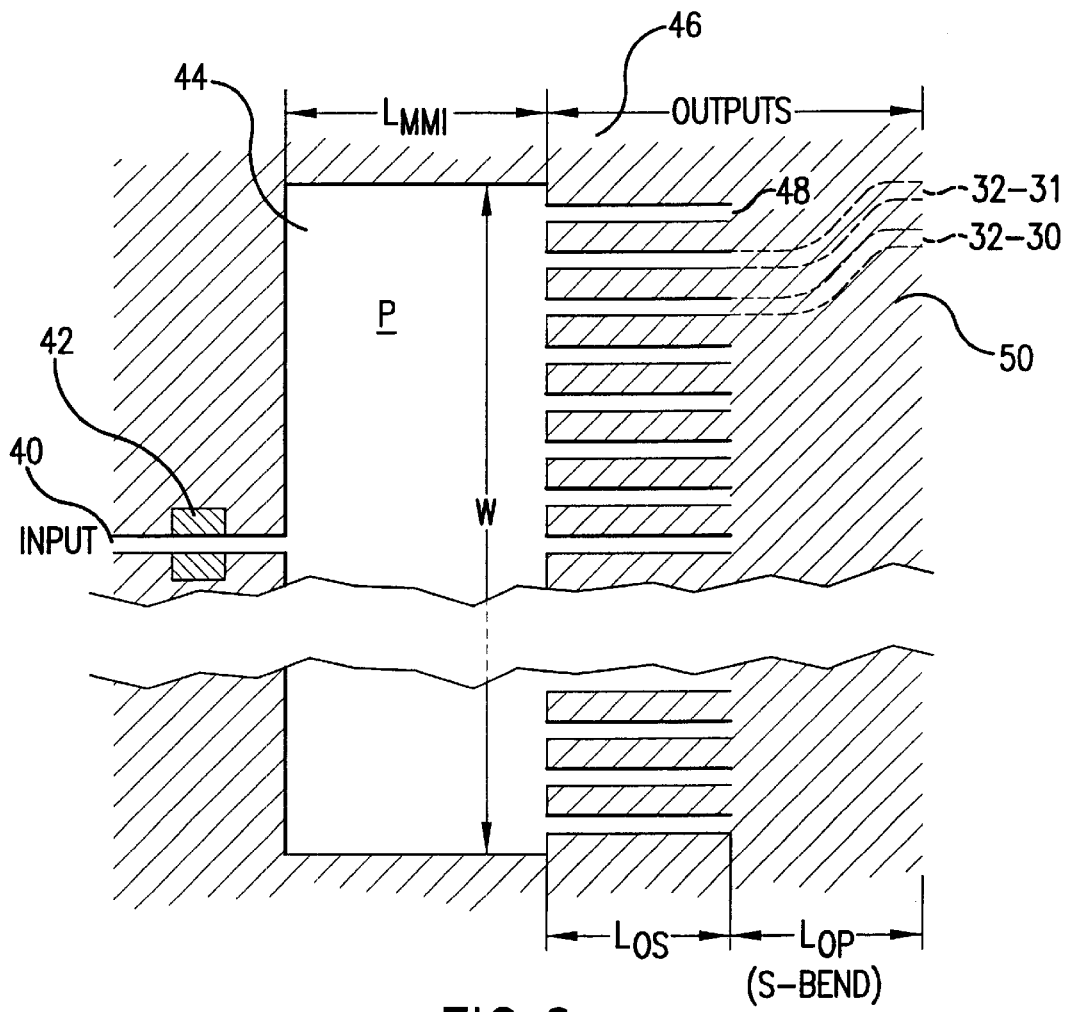
FIG. 6 is a schematic of a 1×32 MMI power splitter integrated with a Bragg reflector.

Similarly, a design of a 1×32 MMI splitter, based on the optical properties of the sol-gel material is shown in FIG. 6. FIG. 6 shows that the 1×32 MMI power splitter of the present invention includes an input 40, a Bragg reflector 42, a multimode interference region 44, and an output region 46. Light input from a source such a laser is coupled to the multimode interference region 44 via the Bragg reflector 42. As before, multiple images (i.e. self-images) of the input light appear at a position in the multimode region. Outputs 32-1 to 32-8 in the output region 16 couple to these multiple images, thus splitting the input light into a plurality of output signals.

Single-mode input and output waveguides (N=32) are 5 μm in width; dimensions of the input waveguides are 2–3 μm in height and 5 μm in width. W is the width and $L_{MMI}$, is the length of MMI region; $L_{os}$ and $L_{op}$ are the lengths of offset straight channels 48 and output S-bend sine waveguides 50, both with uniform spacing (center to center) of W/32 and 50 μm, respectively; $n_f$=1.4846 (sol-gel) and $n_s$=1.445 ($SiO_2$) are the optical indices of refraction for the sol-gel glass of the present invention and thermally grown silicon dioxide, respectfully. The length of MMI, $L_{MMI}$, is calculated by equation (2):

$$L_{MMI} = \frac{n_f}{N\lambda_o}\left(W + \left(\frac{n_s}{n_f}\right)^{2\sigma} \frac{\lambda_o}{\Pi(n_f^2 - n_s^2)^{1/2}}\right)^2 \quad (2)$$

where $\lambda_o$ is the free-space wavelength, and σ=0 for TE and σ=1 for TM. As before, finite difference BPM software simulated the field propagation through the MMI splitter.

To improve the resolution of the simulation in the MMI region, the $L_{op}$ section was removed from the structure for calculation purposes. The simulation determined that a spacing of ≧25 μm is needed to avoid significant coupling between the output waveguides. A center to center spacing of 12.5 μm was set by considering sol-gel fabrication tolerance and structure compactness. The MMI width was accordingly calculated 32×12.5 μm =400 μm. Therefore, from equation (2), $L_{MMI}$=4824 μm and 4823 μm for TE and TM, respectively.

Figure 7A:
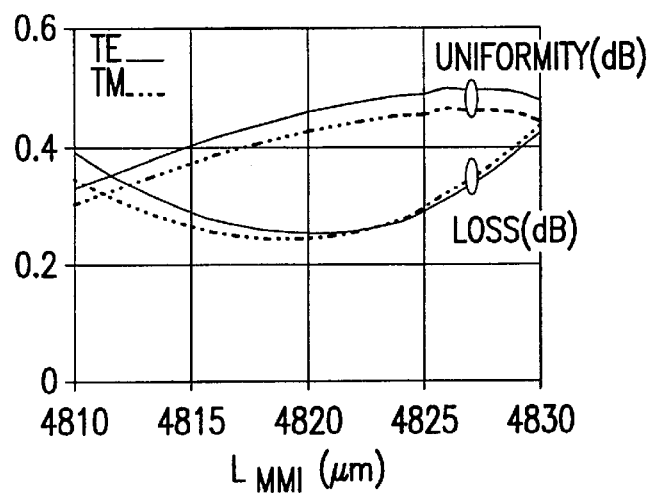
FIG. 7a is a diagram illustrating the loss and power uniformity of a 1×32 MMI power splitter at 1550 nm versus length of MMI region for a fixed width.
Figure 7B:
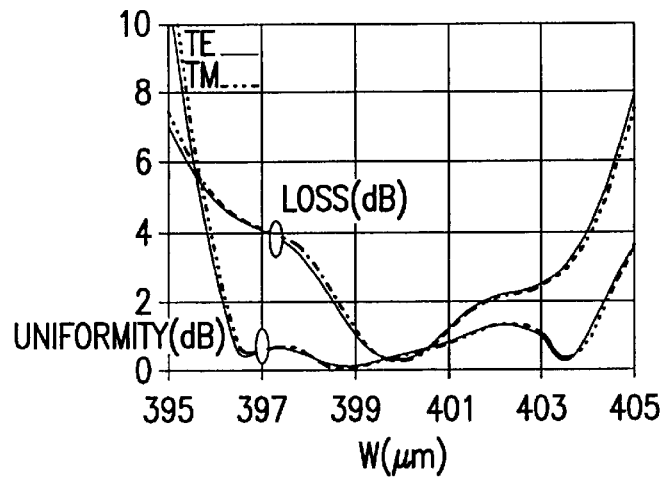
FIG. 7b is a diagram illustrating the loss and power uniformity of a 1×32 MMI power splitter at 1550 nm versus width of MMI region for a fixed length.

To evaluate fabrication tolerances for the 1×32 power splitter, the loss and uniformity (i.e., the ratio of minimum and maximum power in the output waveguides) were calculated for fixed W by varying $L_{MMI}$, and vice versa. The numerical results are shown in FIGS. 7a and 7b for TE and TM polarization. Lower loss materials (e.g. 0.25 dB) in the optical power splitter, where W =400 $\mu$m and $L_{MMI}$=4820 $\mu$m, leads to higher tolerant devices. Although there is a region of excellent uniformity ~0 dB in FIG. 7b, the loss is 1.5 dB. If a loss of $\leq$0.15 dB ($\leq$0.4 dB total) is acceptable, a change of ±10 $\mu$m in $L_{MMI}$, and ±0.5 $\mu$m in W will be acceptable.

Figure 7C:
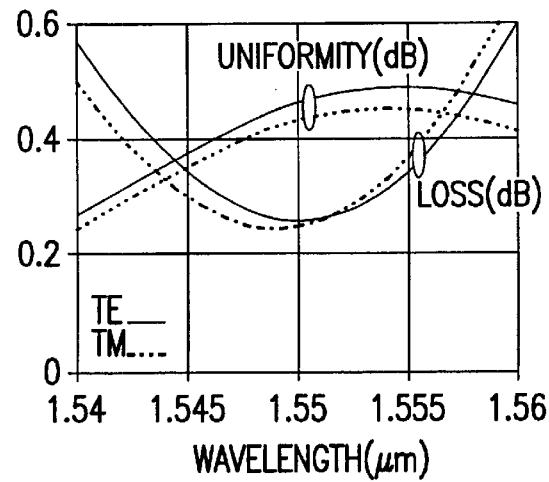
FIG. 7c is a diagram illustrating the loss and power uniformity of a 1×32 MMI power splitter versus wavelength.

Hence, the operation of the 1×32 MMI splitter is more sensitive to the width than the length, and the width should be carefully controlled during optical device fabrication. Also shown in FIG. 7c is the loss and uniformity versus wavelength.

According to equation (2), a similar response is expected for both $L_{MMI}$, and $\lambda$. For a loss of $\leq$0.15 dB ($\leq$0.4 dB total), an optical bandwidth of ±7 nm is determined around 1.55 $\mu$m. This low optical bandwidth means that formation of self-images in MMI power splitters is very phase sensitive, thus specific MMI devices are designed for optical windows at 1.3 $\mu$m and 1.55 $\mu$m. FIGS. 7a, 7b, and 7c show that the MMI power splitter is very weakly polarization sensitive.

Similar to the 1×8 power splitter design, the 1×32 MMI splitter utilizes a straight channel allowing relaxation of the optical field in the $L_{os}$ region before suffering losses in the S-bend regions, thus reducing losses and improving uniformity. The outermost S-Bend waveguides 1, 32 with a bending of 581.25 $\mu$m suffer the largest loss. Assuming a bending loss of $\leq$0.05 dB for each S-Bend, a $L_{op}$=18 mm was determined by the BPM calculations. The design of the 1×32 MMI splitter has a total length $L_{total}$ of 23.82 mm and a total width $W_{total}$ of 1.1675 mm.

Thus, design criteria for both the 1×8 and 1×32 MMI splitters indicate that employing MMI features on silicon substrates through the sol-gel process is an efficient approach for realization of hybrid optoelectronic integration.

Fabrication of Integrated Optical Components

Fabrication of the 1×8 and 1×32 MMI power splitters, described above, proceeded first by synthesizing a sol gel in the following steps. Aluminum-tri-sec-butoxide (20 mol. %) is added to the solution by stirring for ½ hr. Further, H2O is added to complete an hydrolysis reaction (R=2), where R is the molar ratio of water to the silicon alkoxide precursor (i.e. the MAPMS). This step is followed by addition of a few drops of photoinitiator, specifically 2-hydroxy-2-methylpropiophenone (HMPP). The solution in a preferred embodiment includes methacryloxy propyl methoxy silane (80 mol %), aluminum butoxy (20 mol %), water (the molar ratio of water to the above alkoxides is 1.5), and hydroxy methyl propiophenone (3 mol % with respect to MAPMS). Once the solution was aged over night, the sol is homogenous and available to be dispensed. Experiments have shown that aging for 24 hrs is near optimum with the homogenized sol having a useful shelf life about one month. At dispensing, the viscosity necessary for a specific dispensing tool, such as for example a spinner, is adjusted by diluting the aged solution with an inorganic solvent such as ethanol.

For fabrication of the 1×8 MMI splitter, silicon wafers (<100>) with 3-$\mu$m thick thermally grown $SiO_2$ layers were provided as substrates upon which to produce etched gratings through a holographic process. A thin film of photoresist (Shipley 1805) was spin-coated onto the silicon wafers and soft baked. Two beams of light from a He-Cd laser at 442 nm were then projected onto the photoresist for a few seconds at an appropriate angle, $\sin\theta=\lambda/2\Lambda$, to obtain the designed grating periodicity of ~522 nm, which corresponds to the peak gain, $\lambda\approx$1530 nm, of a InGaAs/InP laser structure. The photoresist mask was subsequently developed, followed by etching grating grooves into the oxide using a Freon based reactive ion etch (RIE) machine. The photoresist mask was removed from the oxide surface with acetone, followed by placing the sample in a plasma machine (Plasma Preen 11-862) for 1 min to remove any residual resist.

The homogenized sol was dispensed through a 0.1 -$\mu$m filter onto the etched wafers and spin-coated at 2500 rpm for 30 seconds to produce a sol-gel film. The sol-gel film was thereafter soft baked at 100° C. for 5 minutes. The softbaking step removes excess solvents and sufficiently stabilizes the film structure so that during photo-imprinting the sample will not adhere to the mask. Prebaked samples were then placed in contact with an appropriate mask (resolution of opening: ±0.25 $\mu$m) and straight channel waveguides and MMI splinters were photoinscribed into the sol-gel films using a maskaligner UV-light (275W, $\lambda$=360 nm). The photoinscribed features were then developed in propanol for a few minutes, followed by hard baking at 150° C. in vacuum at 20 mm of Hg for several hours. A cladding layer was deposited onto the phtoinscribed features using a method similar to the one used for the sol gel application. Here, vinyltriethoxysilane (VTES) was dispensed through a 0.1 -$\mu$m filter and spin-coated at 2500 rpm for 30 seconds to produce a sol-gel film. The applied VTES layer was thermally treated at 150° C. in vacuum at 20 mm of Hg to produce the cladding layer.

One important parameter which affects the operation of optical waveguides is the presence of surface roughness. Surface roughness due to the fabrication is the basis of optical scattering, which is the dominant loss mechanism in glass waveguides. To overcome this difficulty, the above-mentioned process for preparing the sol, aging the sol, dispersing the sol to form a sol-gel-film, and curing the sol-gel film were employed. A qualitative study of waveguide structures, prepared according to the method of the present invention, was performed using scanning electron microscopy (SEM). Specifically, the effects of different photoinitiators and sol aging were critical. A 24 hrs sol aging of the sol before application and a DAROCUR® HMPP photoinitiator yielded the best surface smoothness and transverse photoinscription of structures with the least lateral diffusion.

Figure 8A:
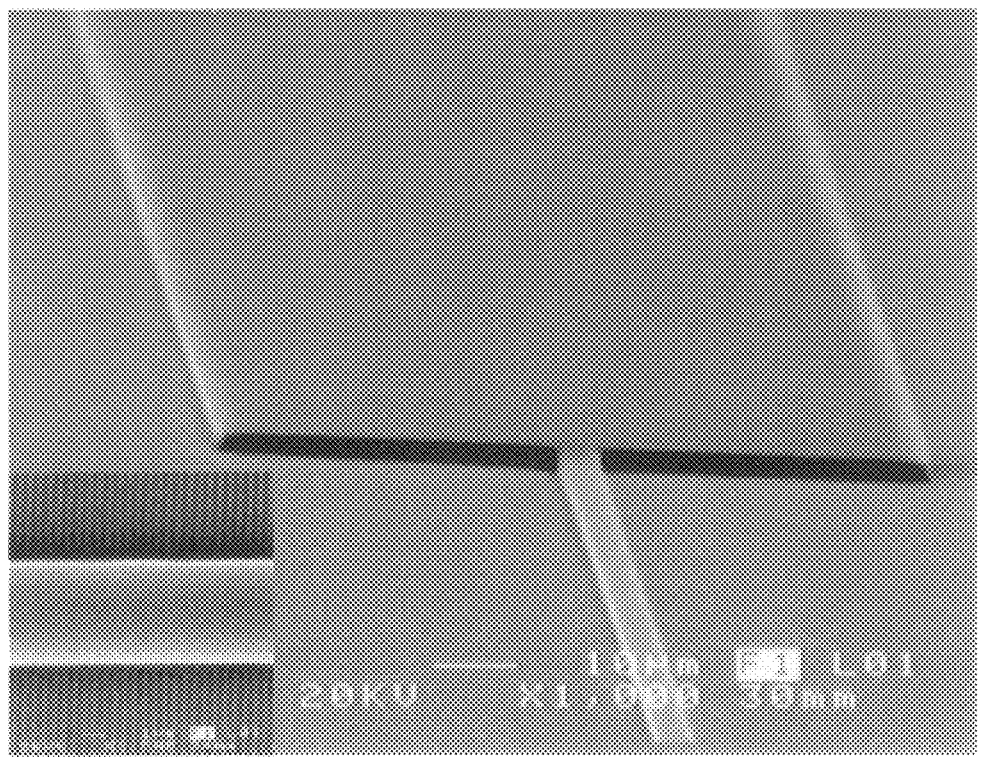
FIG. 8a is a SEM micrograph showing the MMI region of the 1×8 MMI splitter.

FIGS. 8a shows a scanning electron micrograph from the MMI region of the fabricated 1×8 MMI splitter. Vertical sidewalls and surface smoothness are obtained by the process of the present invention. No measurable surface roughness was observed under SEM resolution. Estimates of the surface roughness based on these observations and profilometer traces are surface roughness values of less than 50 nm. The 24 hr sol aging time and the DAROCUR® HMPP photoinitiator yielded excellent surface smoothness and a transverse photoinscription of structures with minimal lateral diffusion.

Figure 8B:
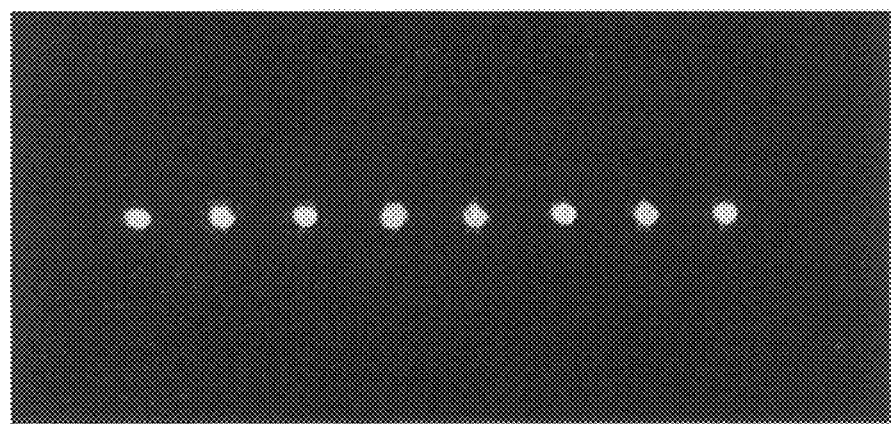
FIG. 8b is a photograph showing light-guiding of the fabricated 1×8 MMI splitter.

A cladding layer is applied to the waveguide. The cladding layer is symmetric and uniform on either side of the ridge waveguide, indicative of successful planarization. FIG. 8b shows light-guiding of the fabricated 1×8 MMI splitter. Complete coverage of the optical devices with the cladding layer, apart from environmental protection, improves the circularity of waveguide modes, and therefore improves optical field matching between the input fiber, the waveguide grating and the output waveguides.

Examination of several structures revealed that the ridges were approximately 2.6 $\mu$m in height after the final curing treatment (i.e. the hard baking). Refractive index of the ridge waveguides was determined using a fully automated prism coupling (to an accuracy of ±0.0003) at two wavelengths, 633 nm and 1550 nm. This determination was carried out by preparing an equivalent planar waveguide. Prism coupling of several samples showed three excited modes at 632.8 nm and one at 1550 nm. The thickness and refractive index of waveguide was accordingly measured to be 2.6 μm, and $n_{1550}$=1.4846, respectively. Using the data for thickness and refractive index at 1550 nm, the BPM simulation also confirmed that the ridges were single-mode at 1550 nm with a mode effective index of 1.4645 for TE and 1.4635 for TM polarized light. These effective index values along with the designed grating periodicity A, ~522 nm, insure that the Bragg reflection will occur around a light wavelength of 1530 nm.

Figure 9:
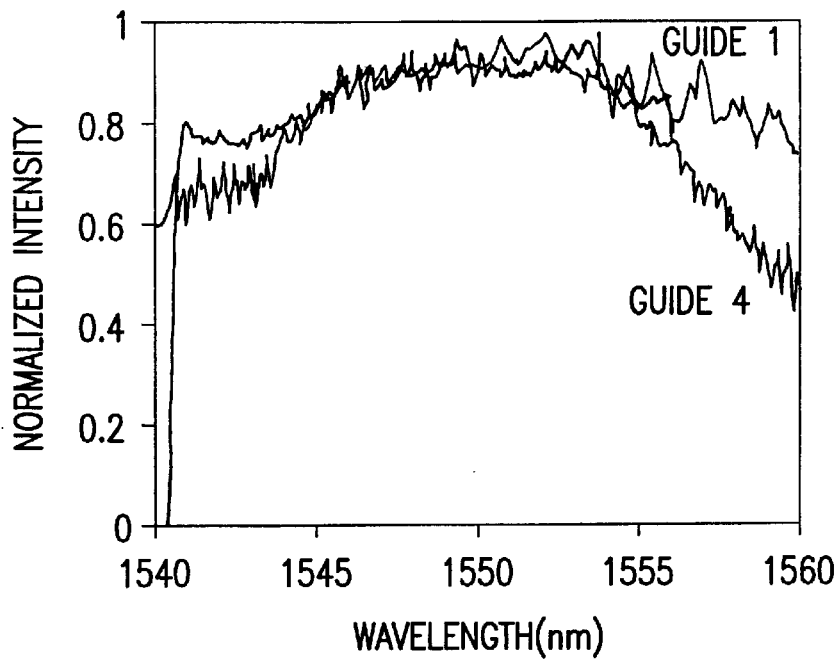
FIG. 9 shows normalized intensity of signals output from guides 8-1 and 8-4 in FIG. 3 versus wavelength.

A tunable diode laser (TE polarized) was used to study the wavelength response of the fabricated 1×8 MMI splitter. FIG. 9 illustrates the responses of output waveguides 8-1 and 8-4. As expected, light intensity reaches a maximum value around the designed wavelength, 1550 nm, and gradually decreases with wavelength detuning. A faster reduction rate in transmitted intensity beyond the designed wavelength is seen in waveguide 8-4 which has a larger S-Bend. Total losses due to the MMI region and S-Bends were estimated by comparing the measured intensity from a 4 cm straight channel with total intensity measured from 8 MMI outputs (4 cm with input channel). The cut-back technique assumes uniform ends for waveguides, which is difficult to achieve with simple diamond-pen cleaving. Several MMI splatters were therefore examined and compared, an average loss of around 1 dB was settled. Comparing the result with FIG. 4b, it is seen that the fabricated 1×8 MMI splitter shows an excess loss of 0.75 dB. Corresponding uniformity ($P_{min}/P_{max}$) between the outputs was also about 1 dB, which is 0.55 dB poorer than the theoretical response in FIG. 4b. As can be understood by those skilled in the art, improvements to the fabrication process and improvements to the cleaving technique will improve loss with performance of the MMI splitters approaching the theoretical predictions. FIG. 9 clearly shows that self-images are formed at the entry of the output waveguides; otherwise intensities in the individual channels would not be identical in intensity. The self-images act as sole sources for input to the output waveguides.

Thus, the fabricated 1×8 MMI splitter is a true manifestation of the design illustrated in FIG. 3.

For fabrication of a 1×32 MMI splitter, after a soft-bake at 100° C. of the sol-gel film, the optical device structures of the 1×32 MMI splitter were photoinscribed into the sol gel film through an appropriate mask (±0.25 μm resolution, ±0.5 μm tolerance) using a maskaligner UV light (275 W). The optical device structures were subsequently developed a few seconds in isopropyl alcohol followed by post-baking at 150° C. in vacuum for several hrs.

Figure 10A:
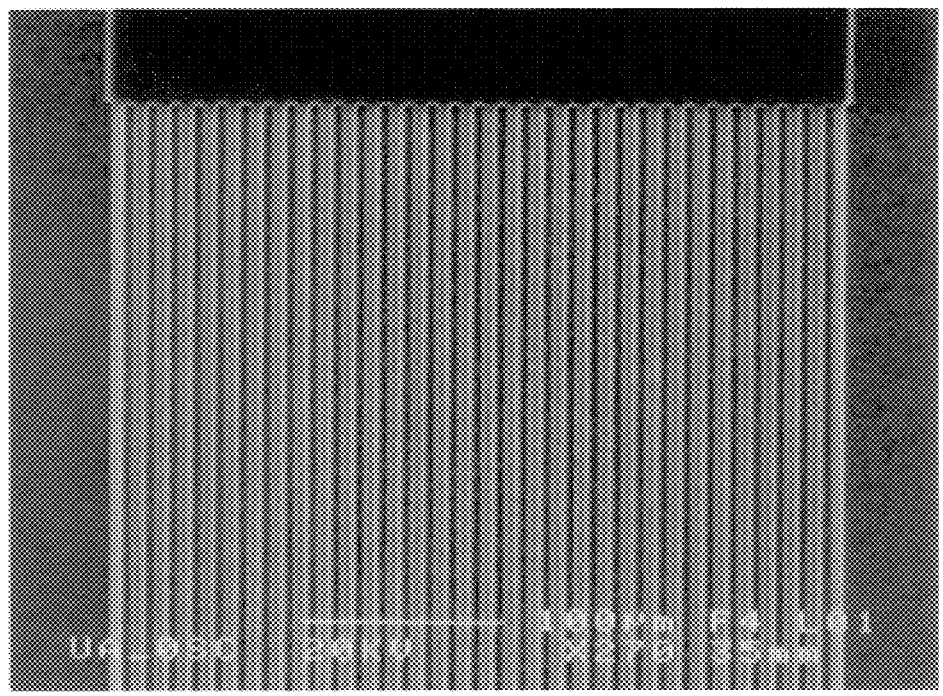
FIGS. 10a and 10b are SEM micrographs from regions of the fabricated 1×32 MMI splitter.
Figure 10B:
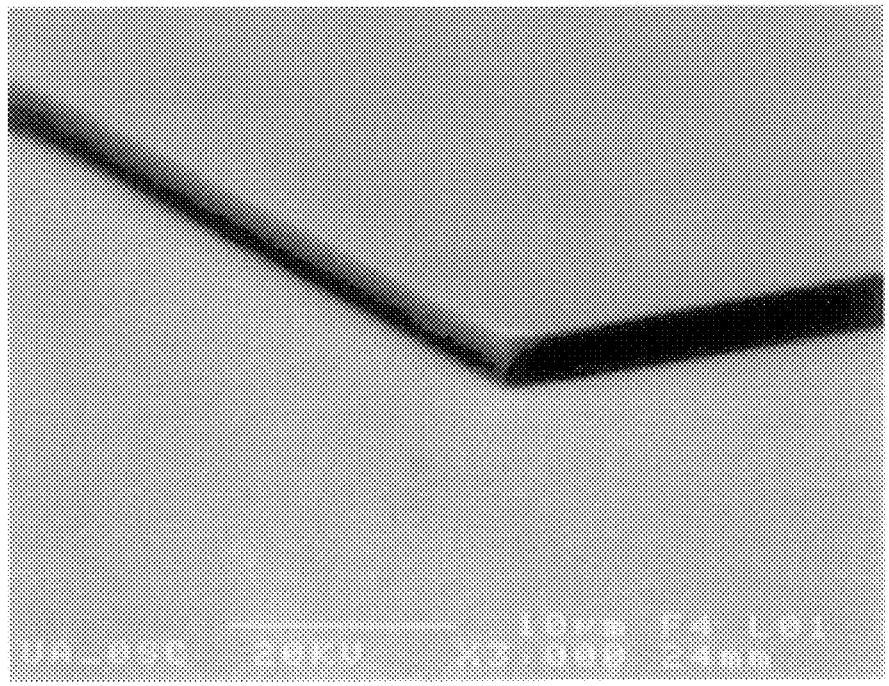
Figure 10C:
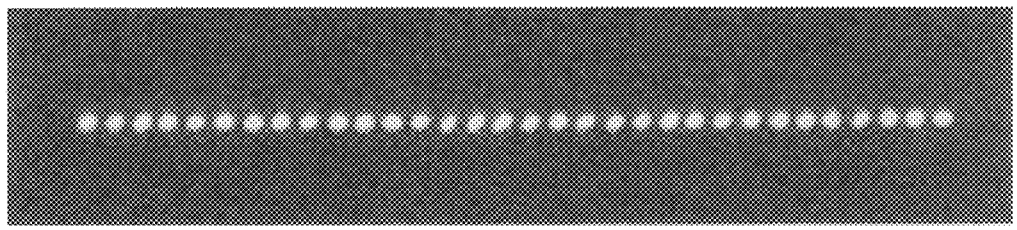
FIG. 10c is a photograph showing light-guiding of the fabricated 1×32 MMI splitter.

FIGS. 10a and 10b show scanning electron micrographs from regions of the fabricated 1×32 MMI splitter. FIG. 10c shows light-guiding of the fabricated 1×32 MMI splitter. The top view of the 1×32 MMI splitter, FIG. 10a, demonstrates an excellent uniform inscription of output waveguides with smooth furcation (i.e. smooth transitions) between MMI region and the output waveguides. FIG. 10b shows that, with almost no defects, the MMI section produced an even surface with smooth vertical sidewalls. Similar features are observed in the cross section view. These figures illustrate reproduction of the design mask, illustrating an important advantage of the fabrication process, i.e., the precise replication of the design mask.

Losses due to the MMI region and S-Bends were estimated by comparing the measured intensity from a 4 cm straight channel with total intensity measured from 32 MMI outputs. The cut-back technique assumes uniform ends for waveguides, which is difficult to achieve with simple diamond-pen cleaving. Two MMI splinters were therefore examined and compared; an average loss of around 1 dB was determined. Comparing the result with the simulated results shown in FIG. 7a, which does not include theoretical loss due to S-Bends, an excess loss of 0.75 dB is seen in the fabricated 1×32 MMI splitter. Corresponding uniformity ($P_{min}/P_{max}$) between the outputs was about 1.4 dB, which is about 0.95 dB poorer than predicted in FIG. 7a. A part of the excess loss is due to small residual roughness along the channels.

Figure 11:
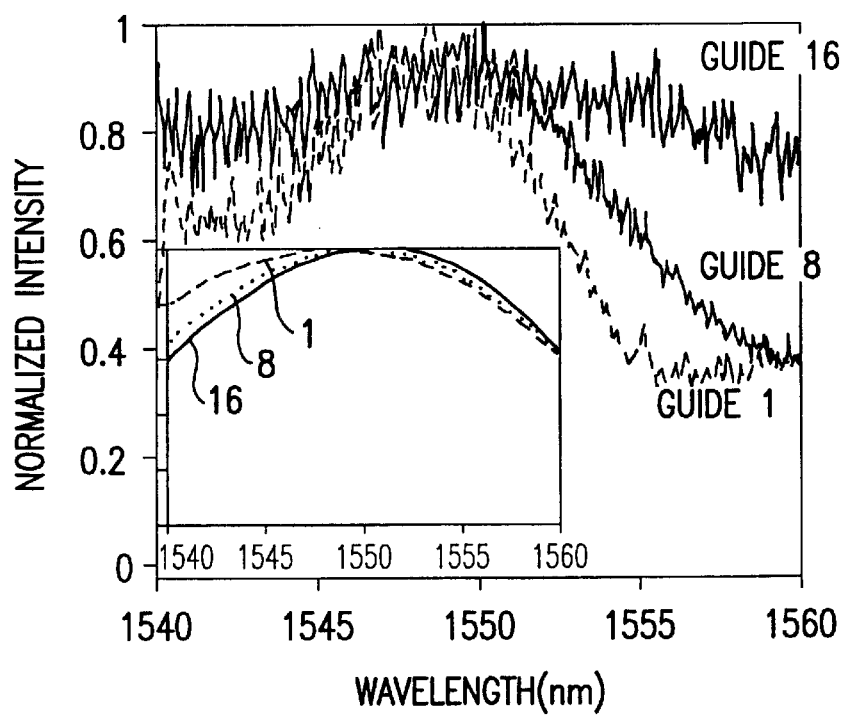
FIG. 11 is a diagram showing the theoretical and experimental outputs of channels 32-1, 32-8, and 32-16 in the 1×32 MMI splitter.

Once again, a tunable diode laser (1510–1580 nm) was used to study the wavelength response. FIG. 11 shows the theoretical and experimental outputs of channels 32-1, 32-8, and 32-16 in the 1×32 MMI splitter. As expected, light intensity reaches a maximum value around the designed wavelength and gradually decreases with wavelength detuning. Channels with larger S-Bends (i.e channels 1 and 8) show a faster reduction rate from detuning than channels with smaller S-bends. Concerning a peak intensity, there is also a 1 nm differentiation for all three channels compared with theoretical responses: 1549, 1550 and 1551 mn. FIG. 11 clearly demonstrates that self-images are formed at the entry of the output waveguides; otherwise, intensities in the individual channels would not be identical in intensity. The self-images in the MMI region, as was true for the 1×8 MMI splitter, act as sole sources for input to the output waveguides.

Thus, the fabricated 1×32 MMI splitter is a true manifestation of the design illustrated in FIG. 6.

The results for the fabricated 1×8 and the 1×32 MMI splitters, presented above, indicate that the processes of the present invention is appropriate for the fabrication of optical array configurations which can filter, signal-route, combine, and split optical input signals.

In a one embodiment of the present invention, sol-gel-based glass waveguides integrated onto silicon substrates provide a platform for hybrid optoelectronic integration. In this hybrid integration, the silicon substrates are utilized as heat sinks and optical benches for optoelectronic chips such as laser diodes with output from the laser diodes coupled into passive glass waveguides (filters, splitters, etc.)

In a preferred embodiment of the present invention, a sol-gel-based glass waveguide grating is integrated with a ridge InGaAsP/InP multiple quantum well (MQW) structure to demonstrate an external cavity distributed Bragg reflector laser.

Figure 12:
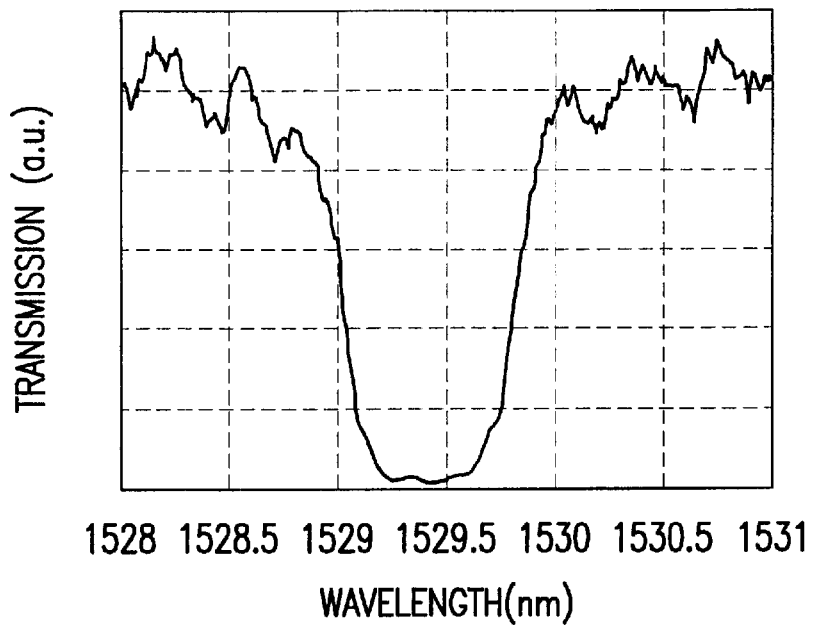
FIG. 12 is a diagram showing the experimental filter response for the straight grating waveguide.
Figure 13:
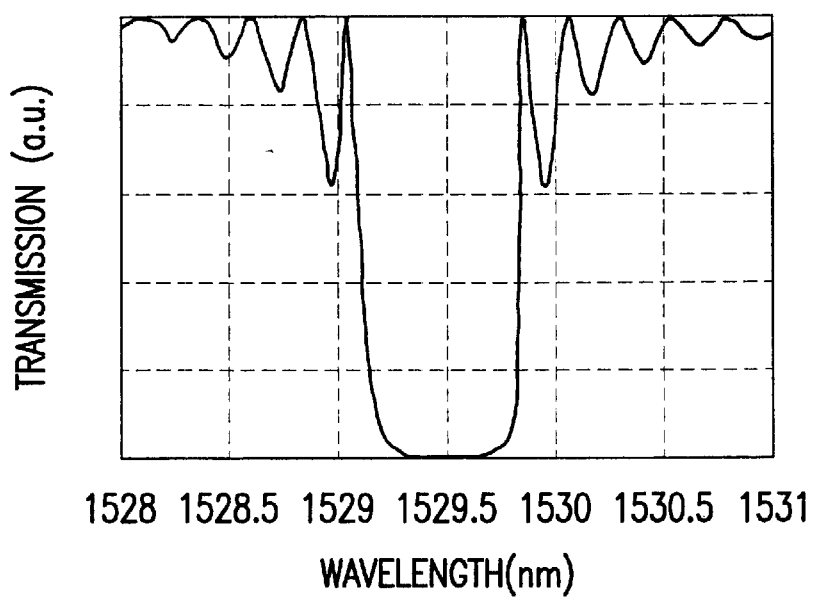
FIG. 13 is a diagram showing the theoretical filter response for the straight grating waveguide.

Initially, a transmission response of a straight grating waveguide was examined using a tunable diode laser operating in the range of 1508–1580 nm. The grating length was 3 mm and the laser linewidth was 0.1 Å. This examination is seen as a prerequisite for determining whether the process is predictable enough to begin fabrication of optical components integrating active components such as laser diodes with the grating waveguides. Light (TE) from diode laser was coupled into the reflectors via a polarization preserving single-mode fiber, and the output, also via a single mode fiber, was monitored on a spectrum analyzer. FIG. 12 is an illustration of the filter response. As can be seen with a full width half maximum (FWHM) of about 8 Å and 98% filtering, the Bragg condition is achieved at 1529.45 nm wavelength. The transmission spectrum shows a very good flat pass band and is a significant improvement over results reported earlier by M. A. Farad et al. in "Sol-gel Grating Waveguides for Distributed Bragg Reflector Lasers", Opt. Lett., vol. 24, pp. 46–462, 1999, whose responses were tapered around the Bragg wavelength. FIG. 13 shows a theoretical response of an identical grating having a FWHM of 8 Å and a reflectivity of 99.7%. With regard to the resolution of measured parameters, the reflector response at 1529.45 nm wavelength is in good agreement with the design wavelength, 1530 nm. Thus, demonstrating suitable process control over the sol-gel processing.

Figure 14:
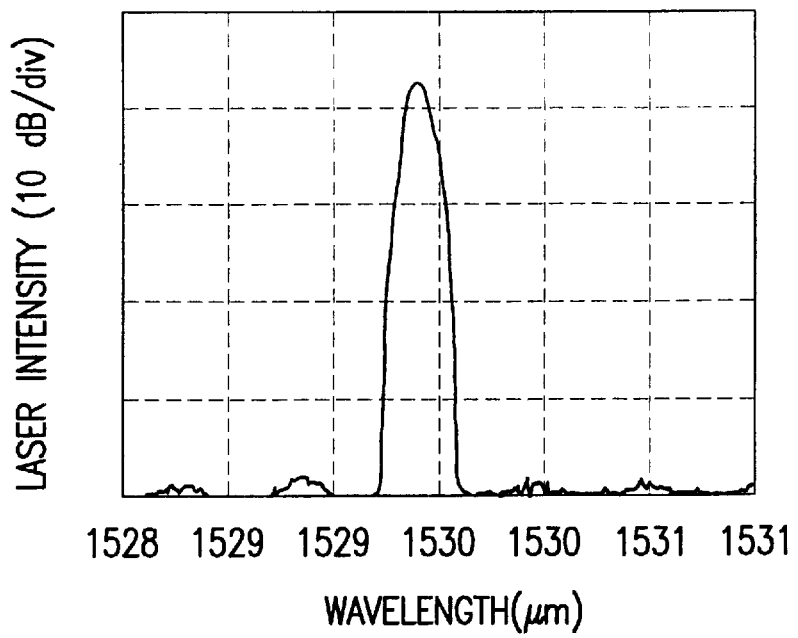
FIG. 14 is a diagram showing the lasing action achieved at 1529.45 nm for a distributed Bragg reflector laser.

Next, the sol-gel grating waveguide was utilized as a feedback resonator to couple the output of a ridge InGaAsP/ InP MQW structure to demonstrate external cavity DBR lasers. One facet of the MQW structure was antireflection (AR) coated to better than 1%, and the other facet was as cleaved. Prior to AR coating, the threshold current of the Fabry-Perot laser was measured to be just above 20 mA. The output of a gain medium from the AR coated facet was lens coupled into the sol-gel grating waveguide, acting as a Bragg grating waveguide, and an optical spectrum analyzer recorded the output emission. The integration of the InGaAsP/InP MQW structure with the sol-gel-based Bragg grating waveguide constitutes a distributed Bragg reflector (DBR) laser. FIG. 14 shows the DBR laser operation of the sol-gel Bragg grating external cavity DBR laser with 40 (dB mode suppression. As can be seen from FIG. 14, the lasing operation is achieved at the Bragg wavelength of the filter, i.e. at 1529.45 nm. The threshold current of the DBR laser under continuous wave (cw) operation was around 30 mA.

Figure 15:
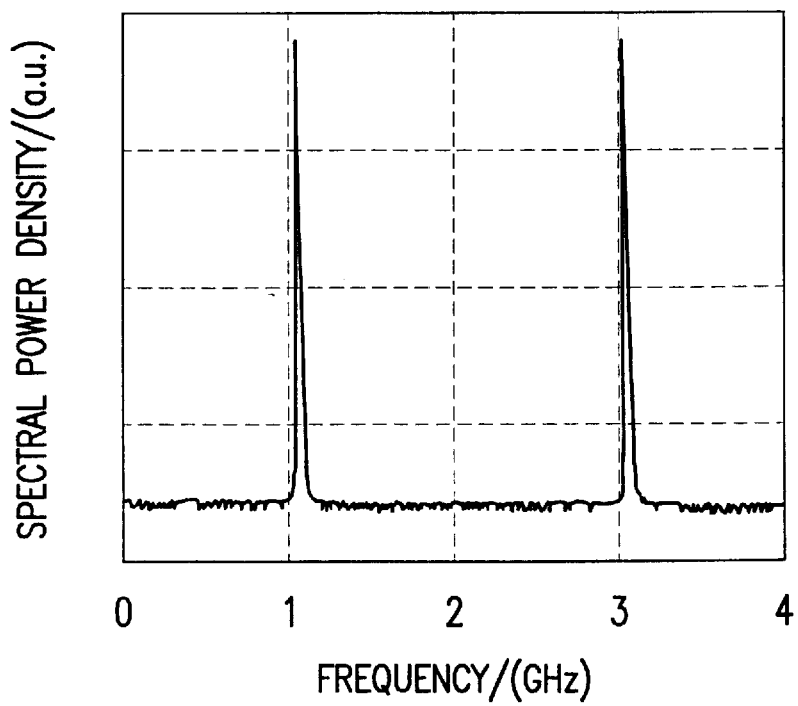
FIG. 15 is a spectra obtained with a Fabry-Perot interferometer of the distributed Bragg reflector laser.

A Fabry-Perot interferometer with a 2 GHz bandwidth was used to confirm single mode operation of the fabricated DBR laser. A series of scans showed one frequency peak repeated every 2 GHz as exhibited in FIG. 15. To measure the DBR laser linewidth, the tunable diode laser was used as a reference and the DBR output was heterodyned. The tunable diode laser had a short-term linewidth of no more than $\Delta v_{ref}$=300 kHz. The differential frequency spectrum produced by the radio-frequency spectrum analyzer had a FWHM of $\Delta v \approx 500$ kHz in all the measurements. Accordingly, the FWHM of the DBR laser linewidth, $(\Delta v^2 - \Delta v_{ref}^2)^{1/2}$, is estimated to be 400 kHz.

Figure 16A:
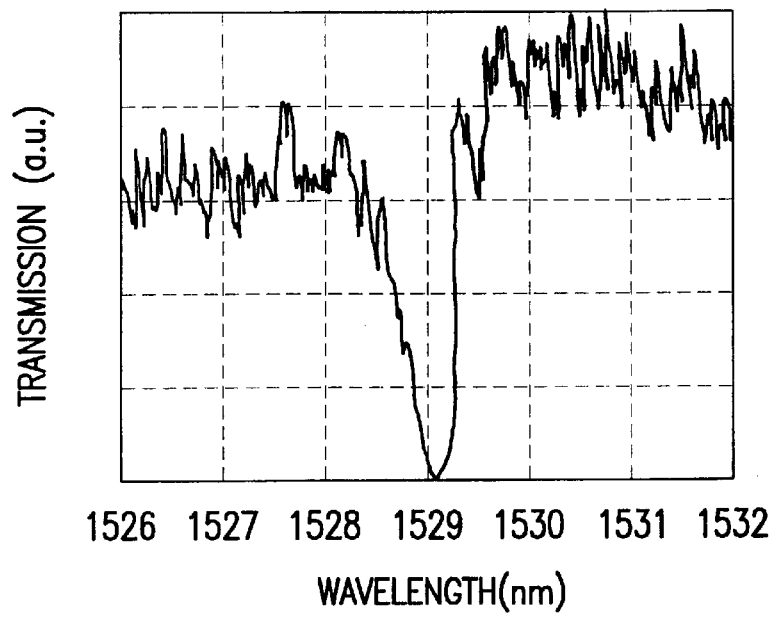
FIG. 16a is a diagram of the transmission through an integrated Bragg reflector and MMI splitter.
Figure 16B:
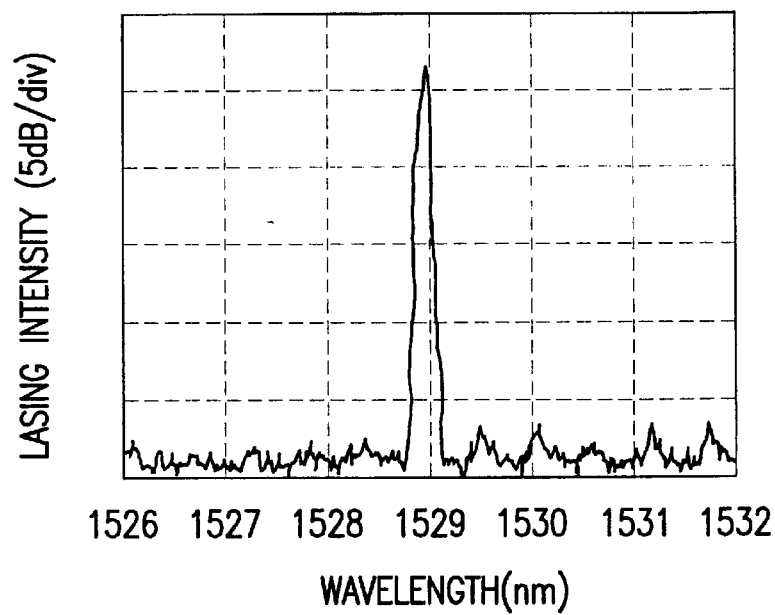
FIG. 16b is a diagram of lasing intensity in an integrated Bragg reflector and MMI splitter.

Extending this work, a sol-gel based DBR laser was integrated to splitter waveguides. In doing this, an 1×8 MMI splitter was made so that the MMI splitter input waveguide rests on the $SiO_2$ grating. Optical transmission of an integrated Bragg reflector and a MMI splitter from one output waveguide is shown in FIG. 16a. FIG. 16a shows that the integrated Bragg reflector shows a FWHM of 6 Å and a reflectivity more than 90% at 1529 nm. An increase in the signal intensity on the spectrum right hand side might be due to the fact that the MMI mask is designed for 1550 nm. Corresponding DBR laser demonstration of the grating MMI splitter is shown in FIG. 16b. The lasing was achieved at 1529 nm with a side mode suppression about 25 dB. Similar filtering and lasing was observed at the output of all the splitter waveguides.

In another preferred embodiment of the present invention, electrically controlled grating outcouplers are integrated with surface emitting lasers to electrically steer an output laser signal.

High power surface emitting lasers are key components for free space interconnects. The development of diode lasers with integrated steering capability can play a very important role in free space tracking and communication. A single mode diode laser, such as for example a distributed feedback laser (DFB) laser or the DBR lasers discussed above, is combined with an electrically controlled grating outcoupler. (ECGO). A transparent electrode on the grating outcoupler can be used for electrical steering of laser emission from the outcoupler.

Figure 17:
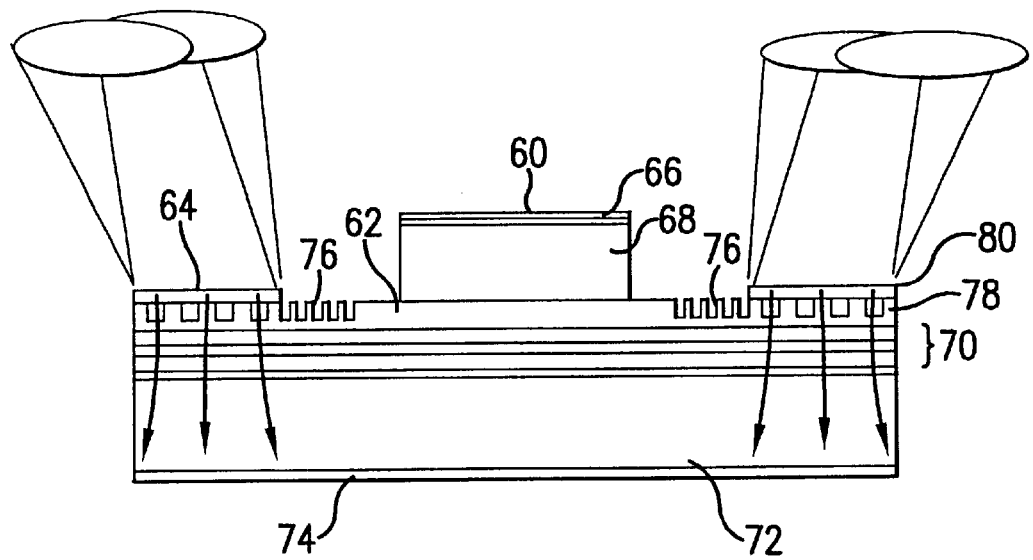
FIG. 17 is a schematic diagram depicting a laser diode, resonator, and electrically controlled outcoupler.

FIG. 17 shows schematically the generic arrangement of a laser diode section 60, surface resonator 62, and electrically controlled grating outcoupler 64. The laser diode section generates light across a p-i-n section in the laser material substrate. The laser diode or gain section 60 section includes a contact 66, a p-type region 68, an i or intrinsic region 70 which could include for example multiple quantum well structures, and a n-type region 72 with a backside contact 74. Forward-bias current in the laser diode section injects electrons into the intrinsic region which recombine, with electrons to generate light. The light is then resonated between two feedback gratings 76 adjacent to the gain region 60, thereby forming a resonator with the feedback gratings serving as partial reflectors. Light partially transmitted by the feedback gratings 76 as laser light is diffracted by a grating outcoupler 78 towards a direction almost normal from the outcoupler. On top the grating outcoupler is a transparent electrode 80 such as for example indium tin oxide. A bias (i.e, a voltage bias or current injection) into the transparent conductive film, as shown by the arrows in FIG. 17, alters the refractive index and changes the diffraction conditions, thus changing the direction of output light from the grating outcoupler.

In another preferred embodiment of the present invention, another transparent electrode (not shown) such as indium tin oxide is deposited on the feedback gratings. By injecting current into the transparent electrode, the optical index of the surface resonator section is varied, affecting the natural resonance frequency of the resonator and providing wavelength tuning. Thus, the present invention allows both beam steering and wavelength tuning of surface emitting lasers.

Accordingly, one method of the present invention is to deposit an electrode, transparent to the lasing wavelength, on top of a detuned second order grating (i.e a grating whose natural resonance frequency is different than the frequency of light output from the laser diode) acting as the feedback grating. Indeed, wavelength tuning has been achieved in a purely second order device (i.e a device in which the periodicity of the grating is $\lambda/n$, where $\lambda$ is the wavelength and n is the optical index of refraction of the grating) with an ITO annulus. A transparent film of ITO, according to one preferred embodiment of the present invention, injects carriers into a passive section of the purely second order device. An increasing shift in wavelength is observed for both forward and reverse biased current injection, which suggests that both localized thermal effects and modification of the effective index of refraction are responsible.

One candidate for the transparent electrode is indium tin oxide (ITO). Electric current injection or voltage bias results in a change of the refractive index of the grating outcoupler, resulting in a change in an output axis of laser emission. The magnitude of the change (i.e. a change in a steering angle) depends on the relative effective refractive index variation ($\Delta n_{eq}/n_{eq}$). A relative refractive index variation of 1% is achievable by current injection corresponding to a steering angle of a few degrees.

Multiple output coupling gratings can be utilized, according to the present invention, to increase the range of steering angle by cascading several grating outcouplers, the cascade producing a cumulative change to the direction of output laser light.

In addition, an array of lasers with different steering angles may be deployed, according to the present invention in steering and tracking applications. Two candidates, but not the only ones, which can be implemented, according to the present invention, for steerable single mode lasers are unstable resonator DBR lasers with steerable grating outcouplers and circular grating DBR lasers with steerable circular grating outcouplers.

Figure 18:
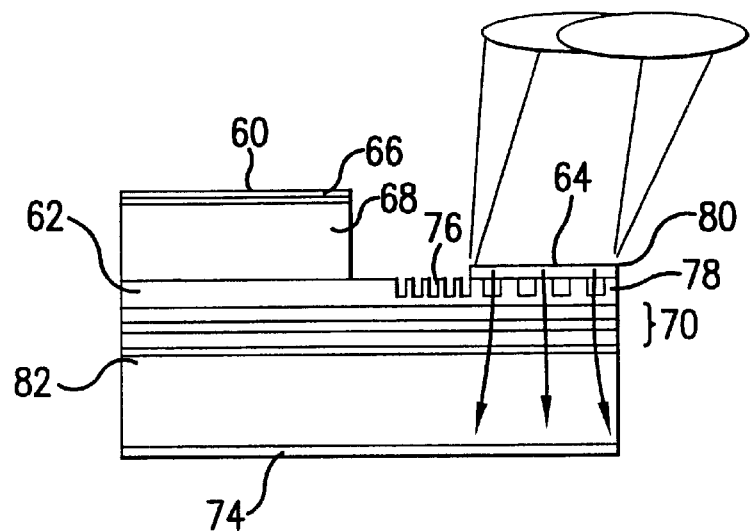
FIG. 18 is a schematic diagram of an electrically controlled grating outcoupler on a detuned second order grating.
Figure 19:
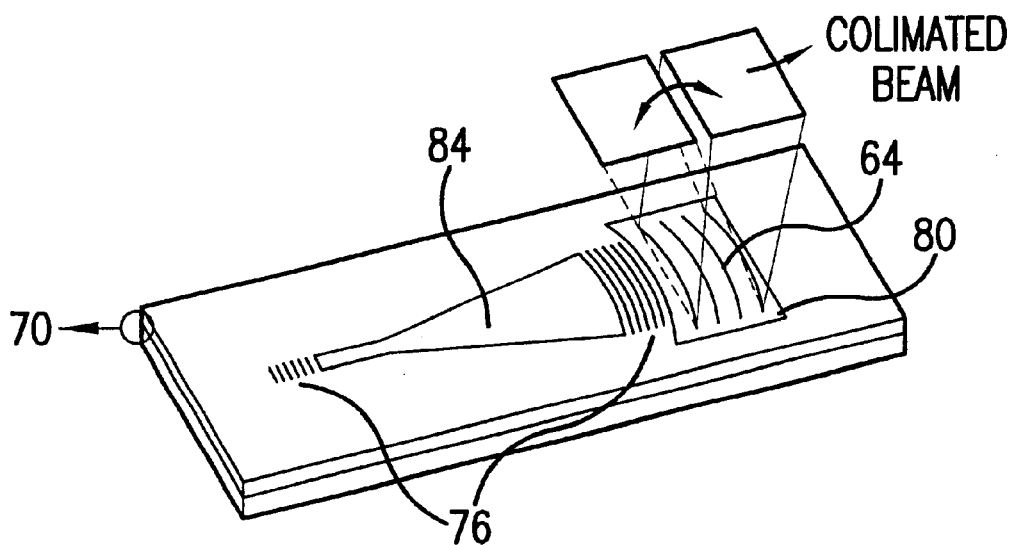
FIG. 19 is a schematic diagram of a steerable unstable resonator DBR.
Figure 20:
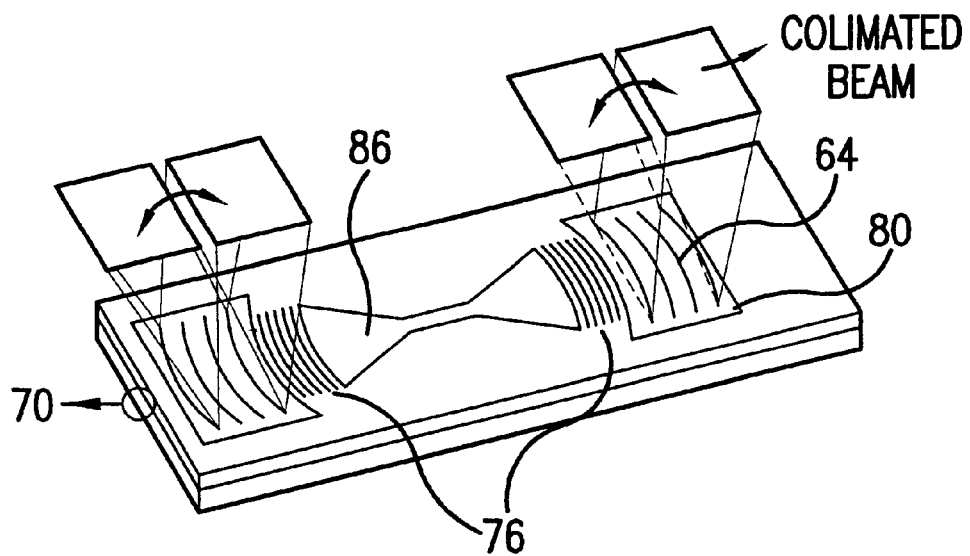
FIG. 20 is a schematic diagram of a steerable bow-tie unstable resonator DBR.

FIGS. 19–22 show these approaches to achieve steerable lasers, including; circular grating DBR laser, unstable resonator lasers, and bow-tie unstable resonator lasers. FIG. 19 shows an unstable steerable laser of similar design as the laser shown in FIG. 18 except that the gain section 84 located between the surface gratings 76 is shaped as a horn. In general, unstable resonators are laser cavities which can provide single lateral mode high power output. The cavity design limits resonance of higher order lasing modes which can create instabilities in the resonator, reducing lasing at the fundamental mode. Another unstable resonator design is the bow-tie unstable resonator surface emitting laser shown in FIG. 20. The bow-tie unstable resonator surface emitting laser is a novel surface emitting laser which consists of two grating outcouplers that can be individually steered, providing a much larger steering angle and steering axis than possible in one device. The design of the gain section 86 between the surface gratings 76 limits resonance of higher order lasing modes.

Figure 21:
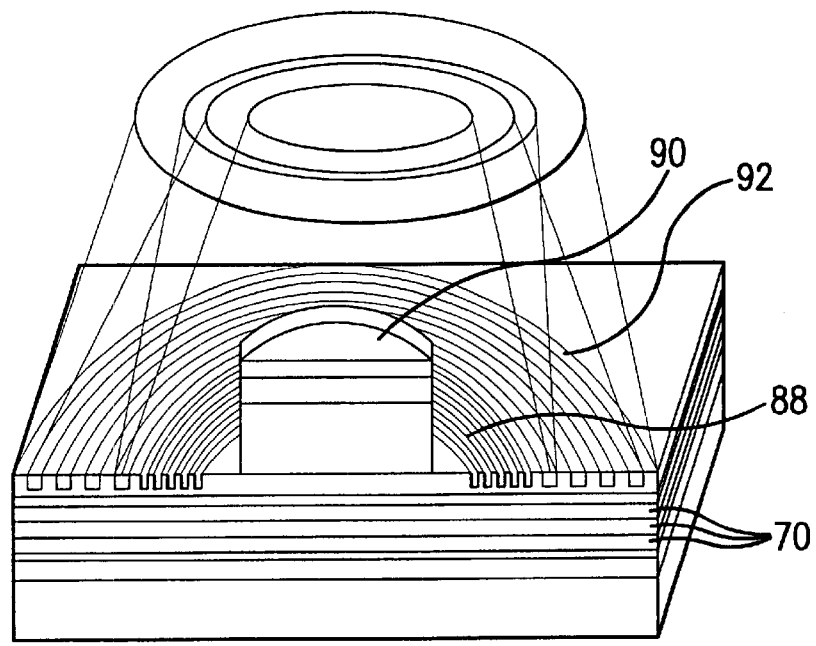
FIG. 21 is a schematic diagram of a steerable circular grating surface emitting DBR laser.

In a preferred embodiment of the present invention, circular grating surface emitting distributed Bragg reflector (CGSEDBR) lasers, as shown in FIG. 21, are integrated to form a hybrid optoelectronic device. Circular feedback gratings 88 are used to resonate the laser light produced in a gain section 90, and a circular grating outcoupler 92 diffracts the laser light. The circular grating outcoupler includes a transparent electrode whose optical index is changed upon application of a bias (i.e. a voltage bias or current injection). A circular laser beam is emitted from the CGSEDBR whose divergence depends on the electrically controlled outcoupler 90. The results below detail the multiple functionality of high power, low divergence CGSEDBR lasers including dynamic beam steering and wavelength tuning. Angular shifts of up to 1° resulted for ITO injection currents of 35 mA. Wavelength shifts of 0.75 nm were observed for reverse biased $I_{ITO}$ of 25 mA.

Figure 23:
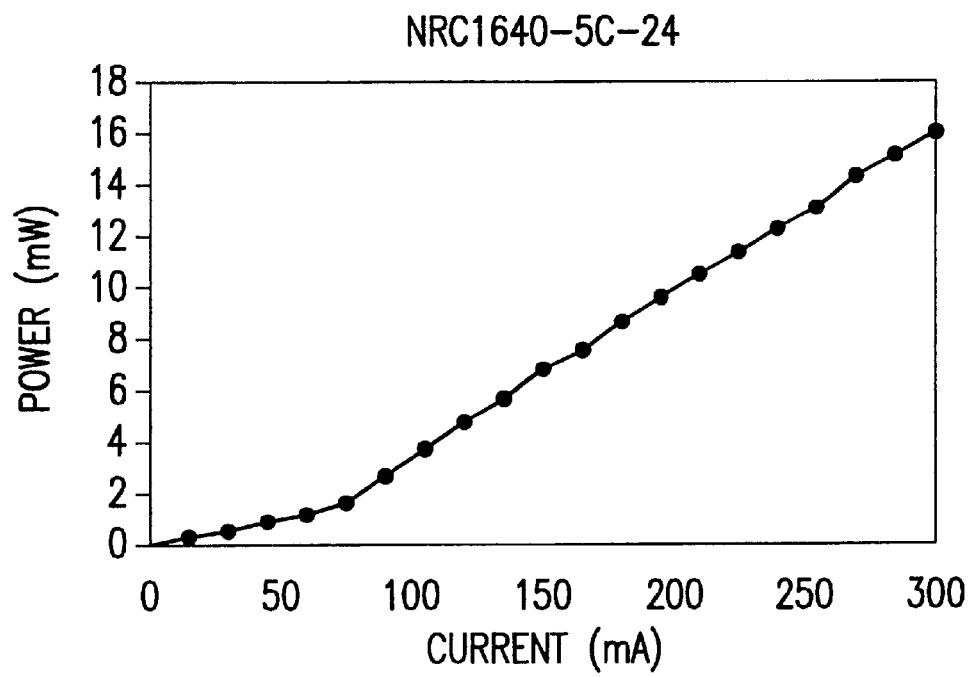
FIG. 23 is a graph of power versus current for a circular grating surface emitting DBR laser.
Figure 24:
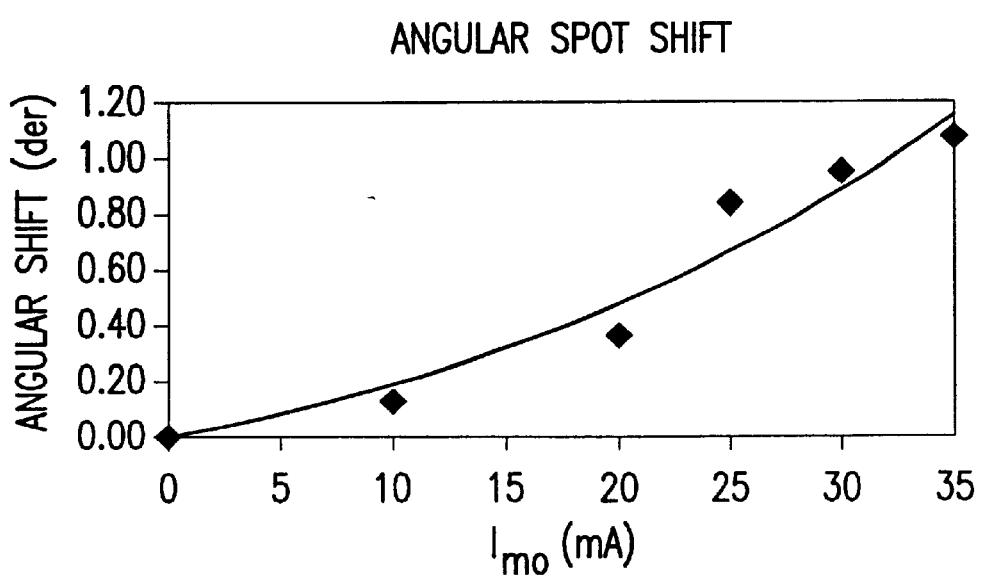
FIG. 24 is a graph of angular shift versus ITO injection current for a circular grating surface emitting DBR laser.

In a preferred embodiment, a transparent film of ITO modifies the effective index of refraction by current injection into the ITO and thereby changes the diffraction angle of the outcoupled light. Angular shifts up to 1° for an ITO injection current of 35 mA were observed in initial devices, but shifts of up to 1° have been obtained. Some devices showed high output power in addition to greater beam steering. Plots of output power versus injection current and angular beam steering versus ITO current injection are shown in FIGS. 23 and 24, respectively. A quadratic fit curve has been included in FIG. 24.

Figure 22:
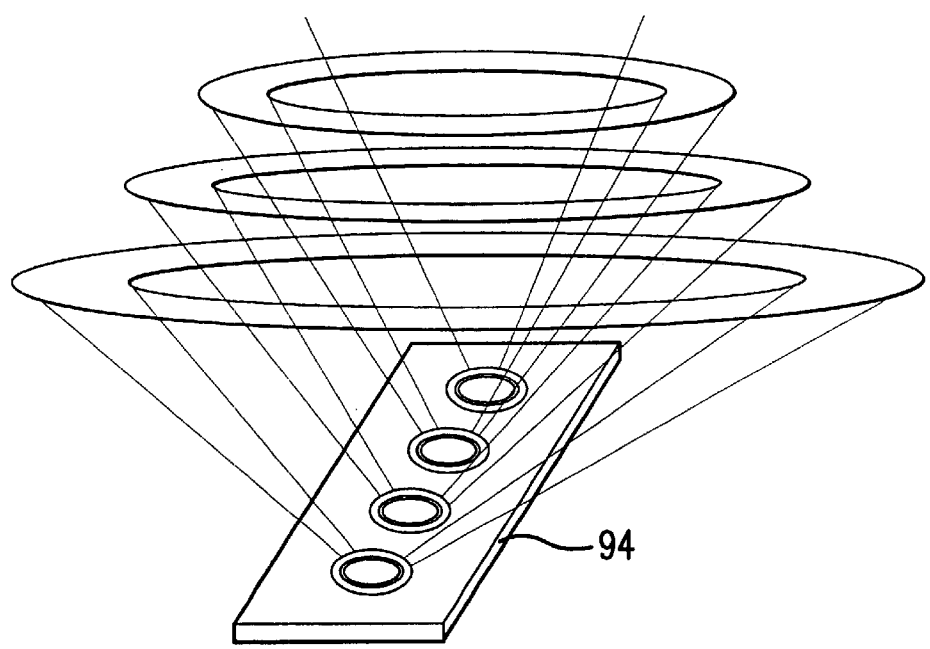
FIG. 22 is a schematic diagram of a steerable circular grating surface emitting DBR laser array.

In addition to the fabrication of singular CGSEDBR lasers, the process of the present invention is used to fabricate an array 94 of CGSEDBR lasers, as shown in FIG. 22. The array, in turn produces an array of circular laser images, the divergence of each beam is controlled by the electrically controlled outcoupler of each section.

Probe stations were used to inject both the p contact and the ITO region on the device, which was placed on a thermo-electrically controlled copper heatsink and held at 20° C. A threshold current of 28.5 mA (threshold current density of 363 A/cm$^2$) was confirmed using an optical spectrum analyzer. The characterization was typically performed at 350 mA (~12 $I_{th}$) which corresponded to an output power of over 110 mW. ITO injection currents up to 25 mA were used. This injection current corresponds to ITO injection current densities on the order of 20 A/cm$^2$. Both forward and reverse biased ITO currents were investigated; however, the best results were obtained under reverse bias.

Figure 25:
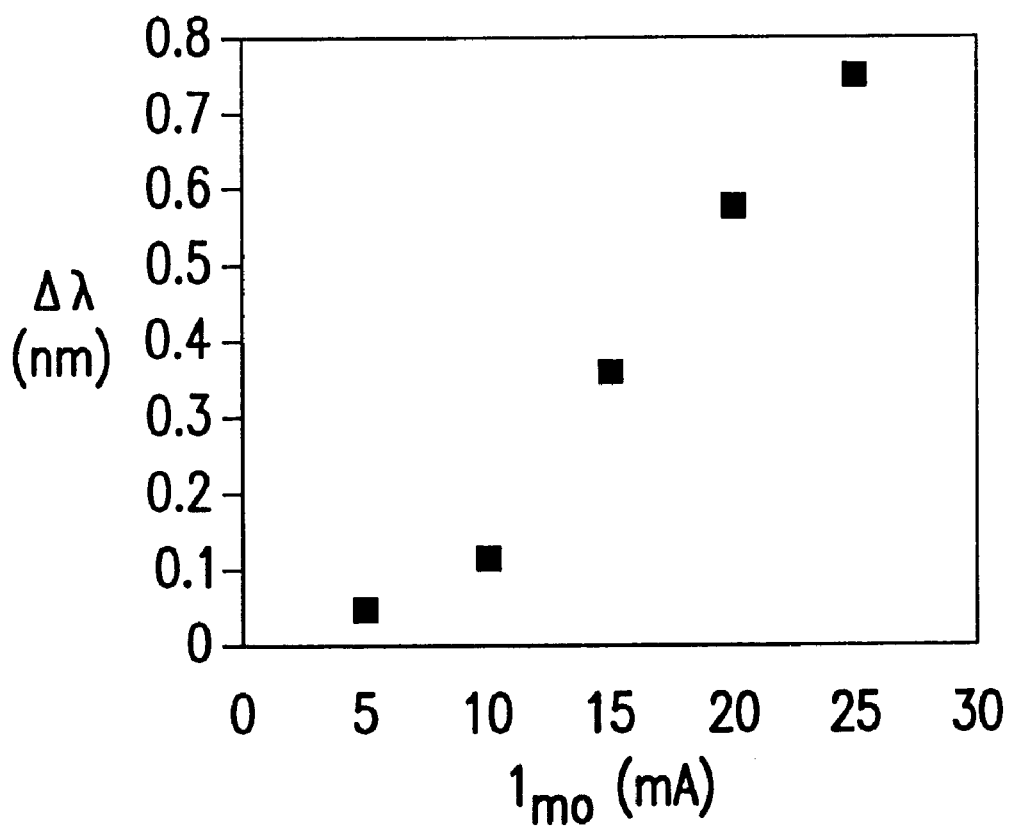
FIG. 25 is a graph of wavelength shift versus ITO injection current for a circular grating surface emitting DBR laser.

L-I characterization of another second order device shows, in pulsed operation, an output power of 225 mW for a drive current of 600 mA. Slope efficiencies of 0.4 mW/mA have been achieved. An L-I plot for this second order device is shown in FIG. 25. Examination of the emission spectrum reveals a lasing threshold current of 30 mA. The resulting threshold current density is 382 A/cm$^2$. The emission wavelength was 983.4 nm results in a derived external differential quantum efficiency of 34.2%.

Figure 26:
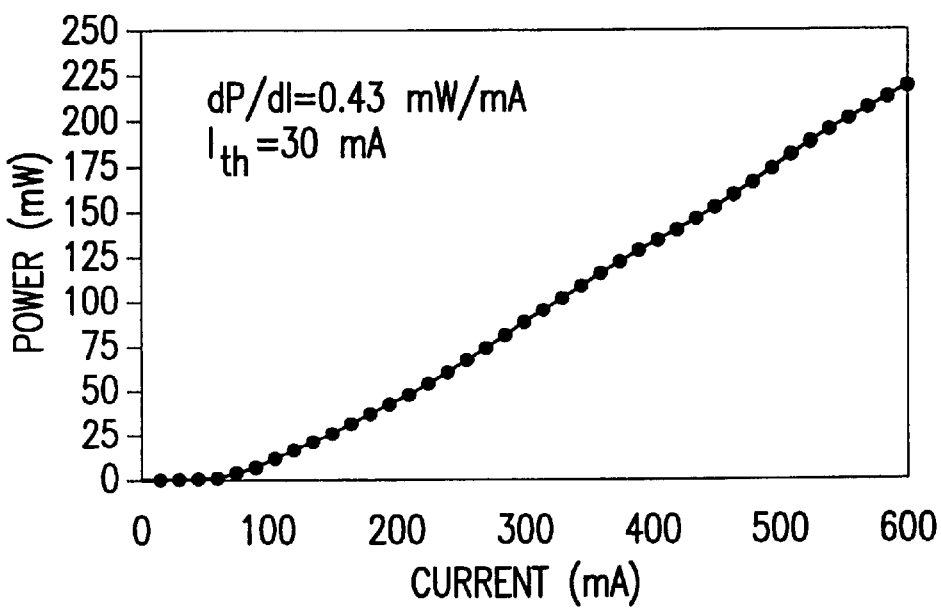
FIG. 26 is a graph of power versus current for another circular grating surface emitting DBR laser.
Figure 27:
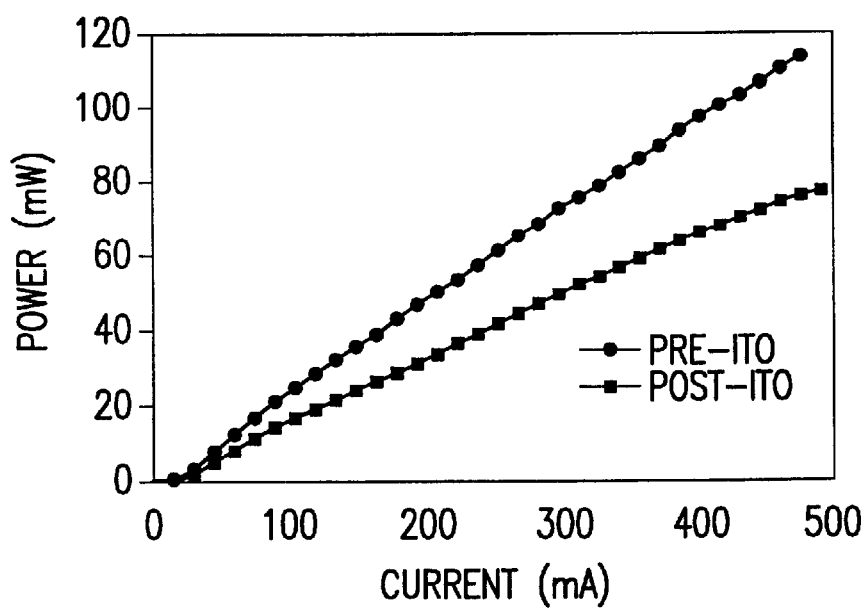
FIG. 27 is a graph of power versus current for a circular grating surface emitting DBR laser with and without an ITO layer.

Determination and minimization of loss mechanisms in the ITO is important for several reasons including device efficiency and heating of the ITO which can fracture the ITO due to thermal stress. A measure of the ITO absorption was obtained by comparing the output power of the same device both before and after ITO deposition. As evidenced by the L-I plots in FIG. 26, there is a 30% reduction in output power after ITO processing. However, this loss is not entirely be attributed to the ITO since the sample was subjected to several more fabrication steps and the contacts were annealed by rapid thermal annealing twice. Nevertheless, this loss does provide an upper bound for losses in the ITO.

Numerous modifications and variations of the present invention are possible in light of the above teachings. It is therefore to be understood that within the scope of the appended claims, the present invention may be practiced otherwise than as specifically described herein.

What is claimed as new and desired to be secured by Letters Patents of the United States is:

1. A method for producing a hybrid optoelectronic device, comprising:

provising a substrate with an input region configured to accept input light; and forming with a sol-gel process a multimode interference region coupled to and contiguous with the input region and configured to accept and replicate the input light as multiple self-images and an output region contiguous with the multimode region and configured to accept and to output the multiple self-images.

2. The method of claim 1, wherein the step of forming with a sol-gel process comprises:

depositing a sol including a photoinitiator onto the substrate to produce a sol-gel film;

photo-implanting the sol-gel film to photo-inscribe structures of the multimode and output regions; and curing the photo-implanted sol-gel film to produce a sol-gel glass containing the structures of the multimode and output regions.

3. The method of claim 2, wherein the step of photo-implanting further comprises:

a contacting the sol-gel film with a mask replicating an at least one passive optical device;

exposing with UV light through the mask a part of the sol-gel film; and developing the sol-gel film to photo-inscribe the at least one passive optical device.

4. The method of claim 3, wherein the step of exposing with UV light comprises:

exposing with a 360 nm light.

5. The method of claim 3, wherein the step of developing comprises:

immersing the sol-gel film in a solvent to remove a part of the sol-gel film not exposed to UV light.

6. The method of claim 5, wherein the step of immersing comprises:

immersing in propanol for at least 3 min.

7. The method of claim 2, wherein the step of depositing a sol comprises:

forming a photoinitiated sol; and dispersing said photoinitiated sol onto said substrate.

8. The method of claim 7, wherein the step of forming a photoinitiated sol comprises, under stirring conditions in room conditions, the steps of:

hydrolyzing partially an organically modified silicon alkoxide to form a solution;

mixing an aluminum alkoxide into the solution;

adding water to complete hydrolysis of the alkoxide groups in the solution;

adding a photoinitiator to the solution; and aging the solution containing the photoinitiator to produce the photo-initiated sol.

9. The method of claim 8, wherein the step of hydrolyzing comprises:

hydrolyzing methyacryloxyl propyl trimethoxy silane.

10. The method of claim 8, wherein the step of mixing comprises:

mixing into the solution aluminum tri-sec-butoxide.

11. The method of claim 8, wherein the step of adding comprises:

adding 2-hydroxy-2-methylpropiophenone to the solution.

12. The method of claim 8, wherein the step of aging comprises:

aging for at least 24 hrs.

13. The method of claim 7, wherein the step of depositing a sol further comprises:

removing excess solvents from the deposited sol-gel film.

14. The method of claim 13, wherein the step of removing comprises:

baking the deposited sol-gel film at 100° C. for at least 5 min.

15. The method of claim 2, wherein the step of curing comprises:

exposing the developed sol-gel film in isopropyl alcohol.

16. The method of claim 15, wherein the step of curing comprises:

baking in a vacuum to produce said sol-gel glass.

17. The method of claim 16, wherein the step of baking comprises:

heating the sol-gel film to at least 150° C.

18. The method of claim 1, wherein the step of providing a substrate comprises:

growing an optically transparent film on said substrate;

producing a grating in the optically transparent film on said substrate to define a distributed Bragg reflector as an input waveguide; and depositing a sol gel film on the grooves to planarize the input region.

19. The method of claim 18, wherein the step of producing a grating comprises:

providing as the substrate a silicon substrate with a $SiO_2$ film;

spinning a photoresist onto the $SiO_2$ film;

exposing the photoresist with a He-Cd laser at 442 nm projected onto the photoresist to form an exposed grating region with a specific periodicity;

developing the photoresist to replicate the specific periodicity of the grating region;

etching grooves into the $SiO_2$ film; and removing remnant photoresist.

20. The method of claim 18, wherein the step of depositing a sol-gel film comprises:

forming a sol-gel layer on the grooves on the optically transparent film with an index of refraction different from the optically transparent film.

21. The method of claim 20, wherein the step of forming a sol-gel layer comprises:

dispensing onto the grooves a sol including approximately 80 mol % methyacryloxyl propyl trimethoxy silane, approximately 20 mol % aluminum tri-sec-butoxide, aqueous 0.01M HCl, and 2-hydroxy-2-methylpropiophenone;

spin-coating the sol at 2500 rpm for 30 seconds;

soft baking at 100° C;

patterning the sol gel film to define a single-mode ridge waveguide;

developing the ridge waveguides in an organic solvent; and baking at 150° C. in vacuum to produce the sol-gel layer.

22. The method of claim 18, wherein the step of providing a substrate comprises:

providing a substrate with at least one laser diode.

23. The method of claim 22, wherein the step of producing a grating comprises:

etching the distributed Bragg reflector adjacent to the at least one laser diode, wherein the distributed Bragg reflector comprises a resonator for the at least one laser diode.

24. The method of claim 23, wherein the step of forming a multimode interference region comprises:

forming a multimode interference region whose length is a distance from an input of the multimode region to a position of the multiple self-images.

25. The method of claim 24, wherein the step of forming an output region comprises:

patterning at least one input to at least one output waveguide at each position of the multiple self-images.

26. The method of claim 25, wherein the step of patterning comprises:

patterning a straight section on each said at least one input, said straight section configured to relax optical fields entering each said input and thereby reduce light scatter.

27. The method of claim 26, wherein the step of patterning comprises:

photo-inscribing eight waveguides whose respective inputs are spaced equidistantly apart from each other.

28. The method of claim 22, wherein the step of patterning comprises:

photo-inscribing thirty-two waveguides whose respective inputs are spaced equidistantly apart from each other.

29. A method for producing a hybrid optoelectronic device, comprising:

providing a substrate with a photoelectronic device;

forming a surface resonator including a light-emitting part of the photoelectronic device and configured to resonate light from the photoelectronic device to produce a laser light;

forming a grating outcoupler contiguous with the surface resonant structure and configured to diffract the laser light outward from the grating outcoupler; and forming on the grating outcoupler a transparent electrode configured to accept at least one of a voltage bias and a current injection to vary an index of refraction of the grating outcoupler and change a direction of the diffracted laser light.

30. The method of claim 29, wherein the step of providing comprises:

providing a substrate with a laser diode.

31. The method of claim 29, wherein the step of forming a transparent electrode comprises:

forming an indium tin oxide film.

32. The method of claim 29, wherein the step of forming a surface resonator comprises:

producing a feedback grating in said substrate at at least one end of the surface resonator.

33. The method of claim 32, wherein the step of producing a feedback grating comprises:

providing as the substrate a laser-material substrate;

spinning a photoresist onto the laser-material substrate;

exposing the photoresist with a He-Cd laser at 442 nm projected onto the photoresist to form an exposed grating region with a specific periodicity;

developing the photoresist to replicate the specific periodicity of the grating region;

etching grooves into the laser-material substrate; and removing remnant photoresist.

34. The method of claim 32, wherein the step of forming a feedback grating comprises:

forming a distributed Bragg reflector.

35. The method of claim 34, wherein the step of forming a feedback grating comprises:

forming a circular grating surface emitting distributed Bragg reflector.

36. The method of claim 32, wherein the step of forming a feedback grating comprises:

forming an unstable resonator.

37. The method of claim 32, wherein the step of forming a feedback grating comprises:

forming a bow-tie resonator.

38. The method of claim 29, wherein the step of forming an outcoupler comprises:

forming multiple outcouplers arranged in tandem to cumulatively direct emission of a laser light from the surface resonant structure through changes to the indices of refraction in each of the multiple outcouplers.

39. A method of producing a hybrid optoelectronic device, comprising:

providing a substrate with a transparent layer and a semiconductor gain section configured to produce light, said transparent layer having a first index of refraction; and forming with a sol-gel glass process a waveguide grating contiguous with the gain section and configured to resonate light from the gain section.

40. The method of claim 39, wherein the step of providing comprises:

providing a laser diode.

41. The method of claim 39, wherein the step of forming comprises:

etching a diffraction grating in the transparent layer;

filling the diffraction grating with a sol-gel layer, said sol-gel layer having a second index of refraction greater than the first index of refraction and patterned to produce a single mode waveguide.

42. The method of claim 41, wherein the step of etching comprises:

spinning a photoresist onto the substrate;

exposing the photoresist with a He-Cd laser at 442 nm projected onto the photoresist to form an exposed grating region with a specific periodicity;

developing the photoresist to replicate the specific periodicity of the grating region;

etching grooves into the substrate; and removing remnant photoresist.

43. The method of claim 41, wherein the step of filling comprises:

dispensing onto the diffraction grating a sol including,
methyacryloxyl propyl trimethoxy silane,
aluminum tri-sec-butoxide,
water, and
2-hydroxy-2-methylpropiophenone;
spin-coating the sol at 2500 rpm for 30 seconds;
patterning the sol to define the single mode waveguide; and
baking at 150° C. in vacuum to produce the sol-gel layer.

44. A method for producing a hybrid optoelectronic device, comprising:

providing a substrate with an optically transparent film;

forming a grating in the optically transparent film on the substrate to define a distributed Bragg reflector (DBR) as a single-mode input waveguide;

mounting a laser diode on the substrate, said laser diode configured to emit input light that is coupled into the input waveguide; and forming with a sol-gel process a multimode interference (MMI) structure including, a sol gel film on the grating to planarize the input waveguide and form a DBR laser with the laser diode, a multimode interference (MMI) splitter coupled to and contiguous with the DBR laser and configured to accept and replicate the input light as multiple self-images, and a plurality of single-mode ridge output waveguides contiguous with the MMI splitter at the positions of the self-images and configured to,accept and output the self-images.

45. The method of claim 44, wherein the optically transparent film is a $SiO_2$ film that is thermally grown on the substrate.

46. The method of claim 45, wherein the step of forming a grating comprises:

spinning a photoresist onto the substrate;

exposing the photoresist with a He-Cd laser having a 442 nm light emission projected onto the photoresist to form an exposed grating region with a specific periodicity;

developing the photoresist to replicate the specific periodicity of the grating region;

etching grooves into the SiO$_2$ film; and removing remnant photoresist.

47. The method of claim 44, wherein the sol-gel film is formed by the steps of:

dispensing onto the grating a sol including,
approximately 80 mole % methyacryloxyl propyl trimethoxy silane,
approximately 20 mol % aluminum tri-sec-butoxide,
aqueous 0.01M HCl, and
2-hydroxy-2-methylpropiophenone;

spin-coating the sol at 2500 rpm for 30 seconds to obtain a gel film;

soft baking at 100° C.;

patterning the gel film to define at least one of said single-mode ridge output waveguides;

developing the single-mode ridge output waveguides in an organic solvent; and baking at 150° C. in vacuum to produce the sol-gel film.

48. A method for producing a surface emitting laser, comprising:

providing a substrate with a laser diode section;

forming a surface resonator including a light-emitting part of the laser diode;

forming a feedback grating in said substrate at at least one end of the surface resonator to resonate light from the laser diode to produce laser light;

forming a grating outcoupler contiguous with the surface resonator and configured to diffract the laser light outward; and forming at least one transparent electrode on at least one of the feedback grating and the grating outcoupler to electrically vary an index of refraction of at least one of the feedback grating and the grating outcoupler and to change at least one of a wavelength and a direction of diffracted laser light.

49. The method of claim 48, wherein one of said at least one transparent electrode is formed on the feedback grating to vary an index of refraction of the feedback grating and is configured to change the wavelength of the diffracted laser light.

50. The method of claim 48, wherein one of said at least one transparent electrode is formed on the grating outcoupler to vary an index of refraction of the grating outcoupler and is configured to change the direction of the diffracted laser light.

51. The method of claim 48, wherein one of said at least one transparent electrode is formed on the feedback grating and another of said at least one transparent electrode is formed on the grating outcoupler to vary respective indices of refraction in the feedback grating and the grating outcoupler, thereby to change the wavelength and the direction of the diffracted laser light.

52. The method of claim 48, wherein the feedback grating and the grating outcoupler are single detuned second order gratings, one of said at least one transparent electrode is formed on one of said single detuned second order gratings and is configured to electrically vary an index of refraction of one of said single detuned second order gratings to change the wavelength of the diffracted light.

53. A method of producing a hybrid optoelectronic device, comprising:

providing a substrate with an optically transparent film;

forming a grating in the optically transparent film on the substrate to define a distributed Bragg reflector (DBR) having a first index of refraction;

mounting a laser diode on the substrate that couples input light into the DBR; and patterning a sol gel film having a second index of refraction greater than the first index of refraction on the grating to planarize the DBR and to produce a single-mode ridge waveguide, said single-mode ridge waveguide configured to form an external cavity DBR laser.

54. The method of claim 53, wherein the step of forming a grating comprises:

spinning a photoresist onto the substrate;

exposing the photoresist with a He-Cd laser having a 442 nm light emission projected onto the photoresist to form an exposed grating region with a specific periodicity;

developing the photoresist to replicate a specific periodicity of the grating region;

etching grooves into the substrate; and removing remnant photoresist.

55. The method of claim 53, wherein the steps of forming the sol-gel film comprise:

dispensing onto the grating a sol including approximately 80 mole % methyacryloxyl propyl trimethoxy silane, approximately 20 mol % aluminum tri-sec-butoxide, aqueous 0.01M HCl, and 2-hydroxy-2-methylpropiophenone;

spin-coating the sol at 2500 rpm for 30 seconds to obtain a gel film;

soft baking at 100° C.;

patterning the gel film to define the single-mode ridge waveguide;

developing the single-mode ridge waveguide in an organic solvent; and baking at 150° C. in vacuum to produce the sol-gel film.

\* \* \* \* \*